United States Patent
Marino et al.

(10) Patent No.: US 10,319,866 B2
(45) Date of Patent: Jun. 11, 2019

(54) LAYOUT TECHNIQUES FOR TRANSCAP AREA OPTIMIZATION

(71) Applicant: QUALCOMM Incorporated, San Diego, CA (US)

(72) Inventors: Fabio Alessio Marino, San Marcos, CA (US); Paolo Menegoli, San Jose, CA (US); Narasimhulu Kanike, San Diego, CA (US); Francesco Carobolante, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/431,109

(22) Filed: Feb. 13, 2017

(65) Prior Publication Data

US 2018/0233603 A1    Aug. 16, 2018

(51) Int. Cl.

| H01L 29/93 | (2006.01) |
|---|---|
| H01L 29/06 | (2006.01) |
| H01L 29/66 | (2006.01) |
| H01G 7/00 | (2006.01) |
| H01L 27/08 | (2006.01) |
| H01L 29/94 | (2006.01) |

(52) U.S. Cl.
CPC .......... *H01L 29/93* (2013.01); *H01G 7/00* (2013.01); *H01L 27/0808* (2013.01); *H01L 29/0692* (2013.01); *H01L 29/66174* (2013.01); *H01L 29/66189* (2013.01); *H01L 29/94* (2013.01)

(58) Field of Classification Search
CPC .......... H01L 29/0692; H01L 29/66174; H01L 27/0808

See application file for complete search history.

(56) References Cited

U.S. PATENT DOCUMENTS

| 6,865,066 B2 | 3/2005 | Kurosawa et al. |
| 7,622,760 B2 | 11/2009 | Ogawa et al. |

(Continued)

FOREIGN PATENT DOCUMENTS

WO    2014194336 A2    12/2014

OTHER PUBLICATIONS

International Search Report and Written Opinion—PCT/US2018/01361613 ISA/EPO—dated Jun. 11, 2018.

*Primary Examiner* — Samuel A Gebremariam

(74) *Attorney, Agent, or Firm* — Patterson & Sheridan, L.L.P

(57) ABSTRACT

Certain aspects of the present disclosure provide a semiconductor variable capacitor. The semiconductor variable capacitor generally includes a semiconductor region, an insulative layer disposed above the semiconductor region, and a first non-insulative region disposed above the insulative layer. In certain aspects, a second non-insulative region is disposed adjacent to the semiconductor region, and a control region is disposed adjacent to the semiconductor region such that a capacitance between the first non-insulative region and the second non-insulative region is configured to be adjusted by varying a control voltage applied to the control region. In certain aspects, the first non-insulative region is disposed above a first portion of the semiconductor region and a second portion of the semiconductor region, and the first portion and the second portion of the semiconductor region are disposed adjacent to a first side and a second side, respectively, of the control region or the second non-insulative region.

10 Claims, 20 Drawing Sheets

(56) References Cited

U.S. PATENT DOCUMENTS

| | | |
|---|---|---|
| 8,013,379 B2 | 9/2011 | Futatsugi |
| 8,498,094 B2 | 7/2013 | Marino et al. |
| 8,803,288 B1 | 8/2014 | Marino et al. |
| 8,963,289 B2 | 2/2015 | Marino et al. |
| 2006/0186511 A1 | 8/2006 | Arnborg et al. |
| 2014/0232451 A1 | 8/2014 | Dutta |
| 2014/0367832 A1 | 12/2014 | Marino et al. |
| 2015/0194538 A1 | 7/2015 | Marino et al. | ically relate
LAYOUT TECHNIQUES FOR TRANSCAP AREA OPTIMIZATION

TECHNICAL FIELD

Certain aspects of the present disclosure generally relate to electronic circuits and, more particularly, to a variable semiconductor capacitor.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure provide a semiconductor variable capacitor. The semiconductor variable capacitor generally includes a semiconductor region, an insulative layer disposed above the semiconductor region, a first non-insulative region disposed above the insulative layer, a second non-insulative region disposed adjacent to the semiconductor region, and a control region disposed adjacent to the semiconductor region such that a capacitance between the first non-insulative region and the second non-insulative region is configured to be adjusted by varying a control voltage applied to the control region (e.g., applied between the control region and the second non-insulative region). In certain aspects, the first non-insulative region is disposed above a first portion of the semiconductor region and a second portion of the semiconductor region, and the first portion and the second portion of the semiconductor region are disposed adjacent to a first side and a second side, respectively, of the control region or the second non-insulative region.

Certain aspects of the present disclosure provide a semiconductor variable capacitor. The semiconductor variable capacitor generally includes a semiconductor region, a first non-insulative region disposed above the semiconductor region, a second non-insulative region disposed above the semiconductor region, a third non-insulative region disposed above the semiconductor region, a fourth non-insulative region disposed above the semiconductor region, wherein the second and third non-insulative regions are disposed above a first portion and a second portion of the semiconductor region, respectively, and wherein the first portion and the second portion are between the first and fourth non-insulative regions, and at least one first control region disposed adjacent to the semiconductor region such that a capacitance between the first non-insulative region and the fourth non-insulative region is configured to be adjusted by varying a control voltage applied to the first control region, wherein the first control region is disposed between the second and third non-insulative regions.

Certain aspects of the present disclosure provide a method for manufacturing a semiconductor variable capacitor. The method generally includes forming a semiconductor region, forming an insulative layer above the semiconductor region, forming a first non-insulative region above the insulative layer, forming a second non-insulative region adjacent to the semiconductor region, and forming a control region adjacent to the semiconductor region such that a capacitance between the first non-insulative region and the second non-insulative region is configured to be adjusted by varying a control voltage applied to the control region, wherein the first non-insulative region is formed above a first portion of the semiconductor region and a second portion of the semiconductor region, and the first portion and the second portion of the semiconductor region are formed adjacent to a first side and a second side, respectively, of the control region or the second non-insulative region.

Certain aspects of the present disclosure provide a method for manufacturing a semiconductor variable capacitor. The method generally includes forming a semiconductor region, forming a first non-insulative region above the semiconductor region, forming a second non-insulative region above the semiconductor region, forming a third non-insulative region above the semiconductor region, forming a fourth non-insulative region above the semiconductor region, wherein the second and third non-insulative regions are formed above a first portion and a second portion of the semiconductor region, respectively, and wherein the first portion and the second portion are between the first and fourth non-insulative regions, and forming at least one first control region adjacent to the semiconductor region such that a capacitance between the first non-insulative region and the fourth non-insulative region is configured to be adjusted by varying a control voltage applied to the first control region, wherein the first control region is formed between the second and third non-insulative regions.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure are generally directed to a semiconductor variable capacitor structure, also referred to as a "transcap," suitable for integrated circuits. A transcap device may have at least three terminals, where the capacitance between two main terminals of the device (C1 and C2) can be varied by changing a bias voltage applied between a control terminal CTRL and one of the other two main terminals (e.g., C2). Aspects of the present disclosure are generally directed to layouts configured to increase the capacitor density of transcap devices by increasing the polysilicon fill factor, while still complying with design rules.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
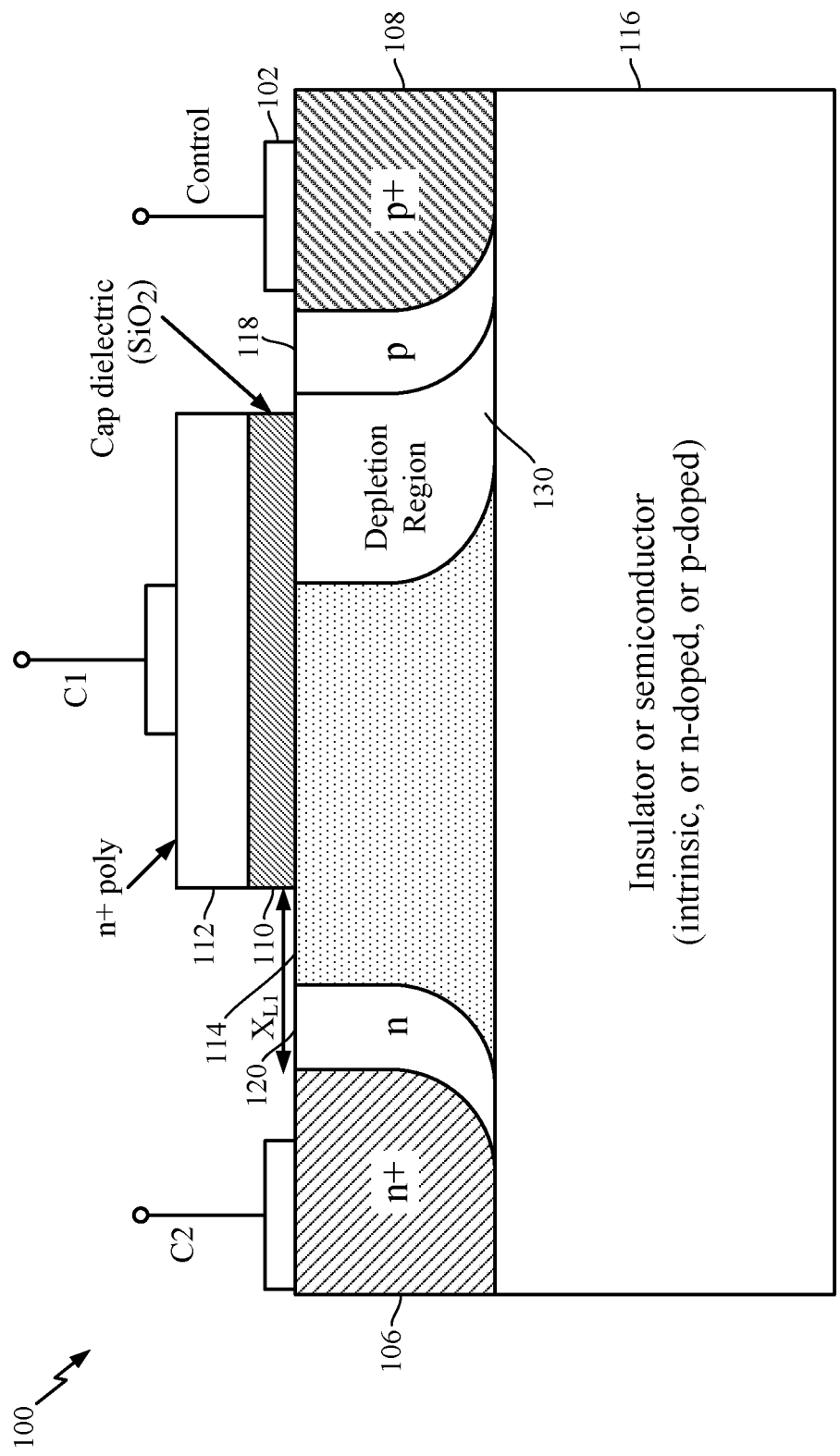
FIG. 1 illustrates an example semiconductor variable capacitor.

FIG. 1 illustrates an example structure of a transcap device 100. Certain implementations of a transcap device use an oxide layer 110, which may be used to fabricate metal-oxide semiconductor (MOS) devices (e.g., thin or thick gate oxide). The transcap device 100 includes a non-insulative region 112 coupled to a first capacitor (C1) terminal, a non-insulative region 106 coupled to a second capacitor (C2) terminal, and a control region 108 coupled to control terminal. The oxide layer 110 may isolate the C1 and C2 terminals, and thus, in effect act as a dielectric for the transcap device 100. The non-insulative region 106 (e.g., n+ implantation region) and the control region 108 (e.g., p+ implantation region) may be formed on the two sides of the transcap device 100 in order to create p-n junctions. As used herein, a C2 non-insulative region generally refers to a region that may be conductive or semiconductive and coupled to a C2 terminal. A control region generally refers to a region that may be conductive or semiconductive and is coupled to a control terminal for controlling a capacitance of a transcap device. A C1 non-insulative region generally refers to a non-insulative region that is isolated from a semiconductor region of a transcap device by an insulative layer, such as the oxide layer 110.

In certain aspects, a bias voltage may be applied between the control terminal 102 and the C2 terminal in order to modulate the capacitance between terminals C1 and C2. For example, by applying a bias voltage to the control terminal 102, a depletion region 130 may be formed between the p-n junction of the control region 108 and the semiconductor region 114. Based on the bias voltage, this depletion region 130 may widen under the oxide layer 110, reducing the area of the equivalent electrode formed by the semiconductor region 114, and with it, the effective capacitance area and capacitance value of the transcap device 100. Furthermore, the bias of the C1 and C2 terminals can be set as to avoid the formation of an inverted region underneath the oxide and operate the transcap device 100 in deep depletion mode. By varying the voltage of the C2 terminal with respect to the C1 and control terminals, both vertical and horizontal depletion regions can be used to modulate the capacitance between the C1 and C2 terminals.

The work-function of the C1 non-insulative region 112 above the oxide layer 110 may be chosen to improve the device performance. For example, an n-doped poly-silicon material may be used (instead of p-doped), even if the semiconductor region 114 underneath the oxide layer 110 is doped with n-type impurities. In some aspects, a metallic material (also doped if desired) may be used for the C1 non-insulative region 112 with an opportune work-function or a multi-layer stack of different metallic materials to obtain the desired work-function. In certain aspects, the C1 non-insulative region 112 may be divided into two sub-regions, one n-doped and one p-doped, or a different metallic material may be used for each sub-region.

In some cases, the semiconductor region 114 may be disposed above an insulator or semiconductor region 116. The type of material for the semiconductor region 116 may be chosen in order to improve the transcap device 100 performance. For example, the semiconductor region 116 may be an insulator, a semi-insulator or an intrinsic/near-intrinsic semiconductor in order to decrease the parasitic capacitances associated with the transcap device 100. In some cases, the semiconductor region 116 can be made of n-doped or p-doped semiconductor with an appropriate doping profile in order to increase the transcap device quality factor and/or the control on the depletion region 130 that may be formed between the control region 108 and the semiconductor region 114 when applying a bias voltage to the control terminal 102. The semiconductor region 116 can also be formed by multiple semiconductor layers or regions doped in different ways (n, p or intrinsic). Furthermore, the semiconductor region 116 can include semiconductors, insulating layers, and/or substrates or can be formed above semiconductors, insulating layers, and/or substrates.

To better understand the working principle of the transcap device 100, it may be assumed that the control terminal 102 is biased with a negative voltage with respect to the C2 terminal. The width of the depletion region 130 in the semiconductor region 114 may be controlled by applying a control voltage to the control terminal 102. The capacitance between the C1 and C2 terminals may depend on the width of the depletion region 130 in the semiconductor region 114, and thus, can be controlled by applying the control voltage to the control terminal 102. Furthermore, the variation of the bias voltage applied to the control terminal 102 may not alter the DC voltage between the C1 and C2 terminals, allowing for improved control of the device characteristics.

In some cases, it may be preferable to have the C2 non-insulative region 106 and/or control region 108 a distance away from the oxide layer 110 in order to reduce the parasitic capacitance associated with the control region 108 and improve the isolation of the C2 non-insulative region 106 for high control voltages. For example, the C2 non-insulative region 106 can be partially overlapped with the oxide layer 110, or the C2 non-insulative region 106 can be formed at a distance from the edge of the oxide layer 110 to increase the device tuning range and linearity. In the latter case, the voltage-withstanding capability of the device is improved since a portion of a radio-frequency (RF) signal, that may be applied to the C1 and C2 terminals, drops between the oxide edge and the C2 non-insulative region 106 instead of being applied entirely across the oxide layer 110. The control region 108 can be partially overlapped with the oxide layer 110, or the control region 108 can be spaced apart so as to reduce the parasitic capacitance between the C1 terminal and the control terminal 102.

A p-doped region 118 can be optionally used to improve the breakdown voltage of the p-n junction between control region 108 and semiconductor region 114, decreasing, at the same time, the parasitic capacitance between the C1 terminal and the control terminal 102. Similarly, an optional n-doped region 120 can be added between the C2 non-insulative region 106 and semiconductor region 114 in order to regulate the doping concentration between the oxide layer 110 and the C2 non-insulative region 106.

Figure 2:
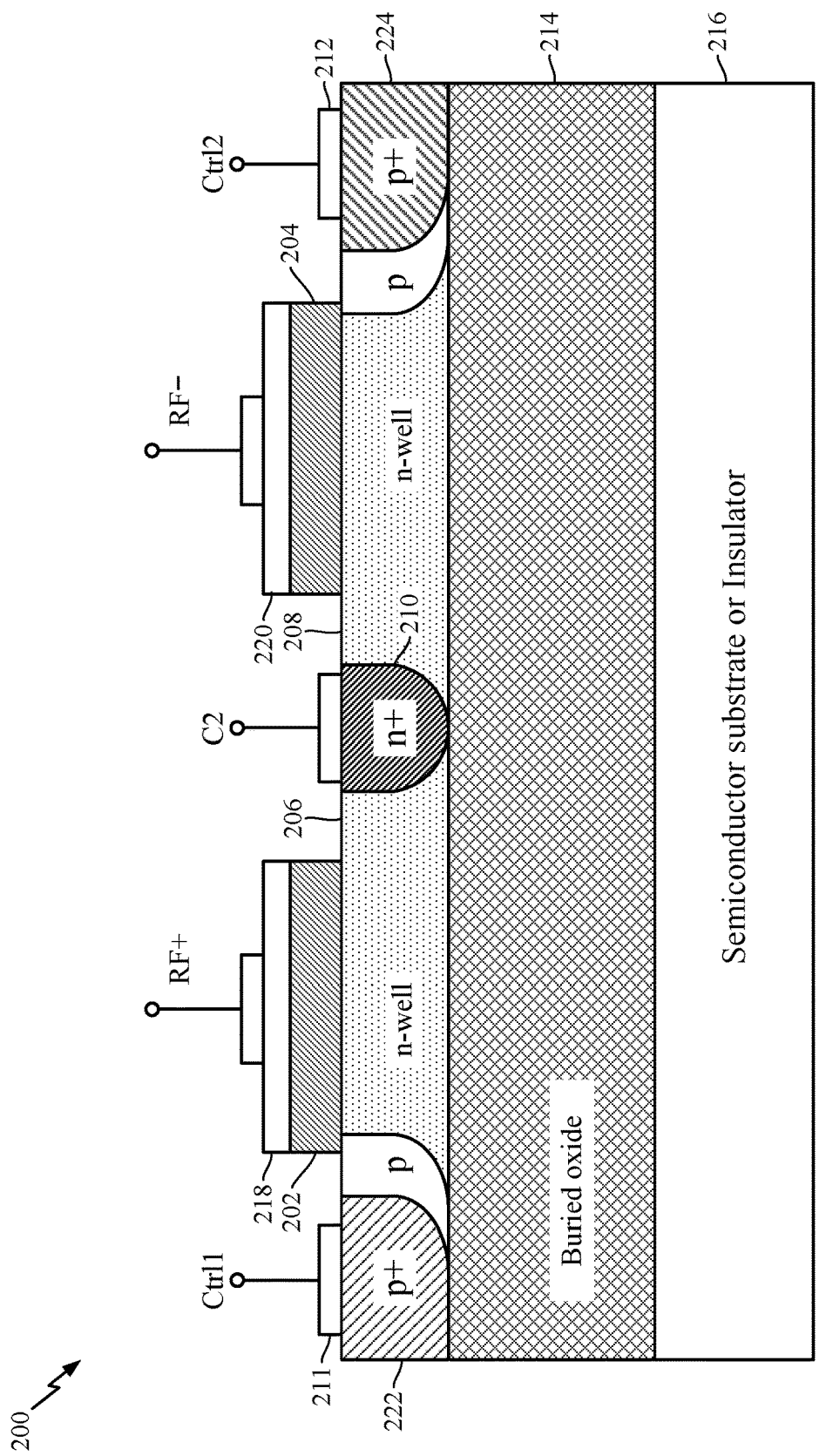
FIG. 2 illustrates an example differential semiconductor variable capacitor.

FIG. 2 illustrates an example differential transcap device 200. The differential transcap device 200 can be obtained by disposing two of the transcap devices 100 back-to-back. In this example, RF+ and RF− terminals (e.g., corresponding to the C1 terminal in FIG. 1) correspond to the positive and negative nodes of a differential RF port for a differential RF signal. The RF+ terminal may be coupled to a C1 non-insulative region 218, and the RF− terminal may be disposed on a C1 non-insulative region 220, each disposed on respective oxide layers 202 and 204. N-well regions 206 and 208 may be coupled to a C2 terminal via a C2 non-insulative region 210 (e.g., n+), as illustrated. The differential transcap device 200 also includes control terminals 211 and 212, each coupled to a respective control region 222 and 224. A bias voltage may be applied to the control terminals 211 and 212 (or to the C2 terminal with respect to the other terminals of the device) to adjust a depletion region of the n-well regions 206 and 208, respectively, thereby adjusting the capacitance between respective RF+ and RF− terminals and the C2 terminal. In some aspects, a buried oxide layer 214 may be positioned below the n-well regions 206 and 208 and above a semiconductor substrate or insulator 216, as illustrated.

The capacitance density achievable with the transcap technology can be increased at the expense of device performance. For example, with reference to FIG. 2, the capacitance density can be improved by reducing the distance between the C1 non-insulative regions 218 and 220 for the RF+ and RF− terminals. However, reducing the distance between the C1 non-insulative regions 218 and 220 may increase the parasitic capacitance associated with the structure, lowering the tuning range of the transcap device 200.

As another example with reference to FIG. 1, the capacitance of the transcap device 100 may be limited by the C1 polysilicon/oxide area. The total semiconductor area of the transcap device 100 may be the sum of the area occupied by the control region, the C1 non-insulative region 112, the non-insulative region 106, and the misalignment region (i.e., "$X_{L1}$" multiplied by the device width). Depending on the length of the C1 non-insulative region 112, the percentage of silicon area used by the other regions of the transcap device 100 can become significant, usually exceeding the area occupied by the oxide layer 110. Moreover, certain device specifications such as high linearity may be achieved with either thick thermal oxides or the series connection of multiple transcap devices, which further increases the area occupation of the transcap device. Certain aspects of the present disclosure are directed to different layout schemes that may reduce the layout area and increase capacitance density, without degrading the device performance.

Figure 3:
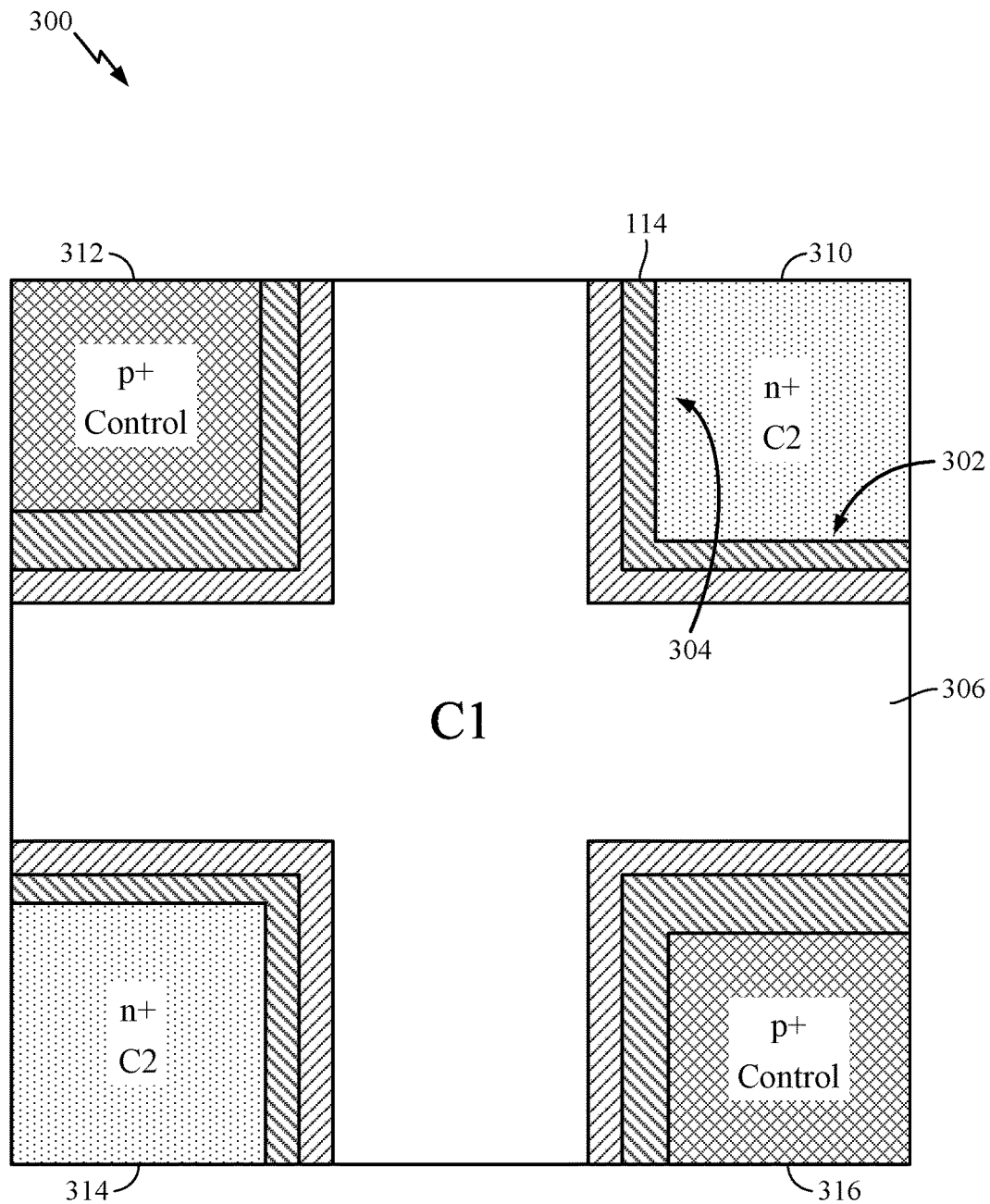
FIG. 3 illustrates an example semiconductor variable capacitor structure using a cross-shaped non-insulative region, in accordance with certain aspects of the present disclosure.

FIG. 3 illustrates a top view of an example transcap structure 300 using a cross-shaped C1 non-insulative region 306, in accordance with certain aspects of the present disclosure. The transcap structure 300 includes a cross-shaped C1 non-insulative region 306 (e.g., polysilicon region coupled to a C1 terminal) disposed above a semiconductor region 114, allowing for increased active polysilicon area density with respect to conventional implementations. The parasitic capacitance, normalized to the active polysilicon area, is also reduced when compared to conventional designs. For example, the C2 non-insulative region 310 and the control region 312 may be disposed in corner regions of the transcap structure 300. As illustrated, the C1 non-insulative region 306 is cross-shaped.

The C1 non-insulative region 306 may be disposed above a portion of the semiconductor region 114 that is disposed adjacent to a first side 302 and a second side 304 of the C2 non-insulative region 310. In certain aspects, the C2 non-insulative region 310 of the transcap structure 300 may be coupled to a C2 non-insulative region 314 disposed at a diagonally opposite corner of the transcap structure 300 (the bottom left corner in the illustration of FIG. 3). In certain aspects, the control region 312 (disposed at the top left corner of FIG. 3) may be coupled to a control region 316 disposed at a diagonally opposite corner of the transcap structure 300 (at the bottom right corner of FIG. 3). In certain aspects, one of the C2 non-insulative regions 310 or 314 may be replaced with a control region, or one of the control regions 312 or 316 may be replaced with a C2 non-insulative region.

Figure 4:
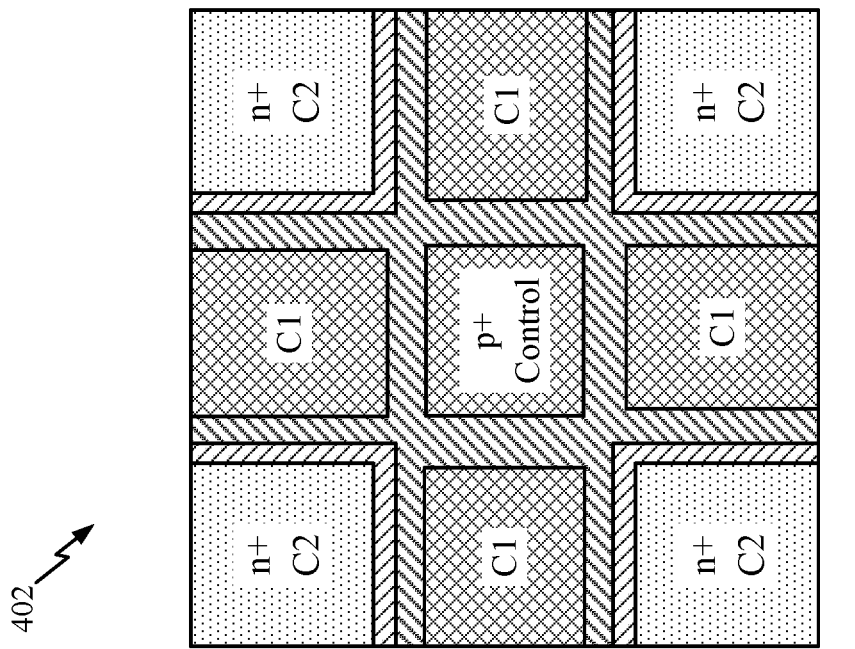
FIG. 4 illustrates example semiconductor variable capacitor structures, in accordance with certain aspects of the present disclosure.
Figure 4:
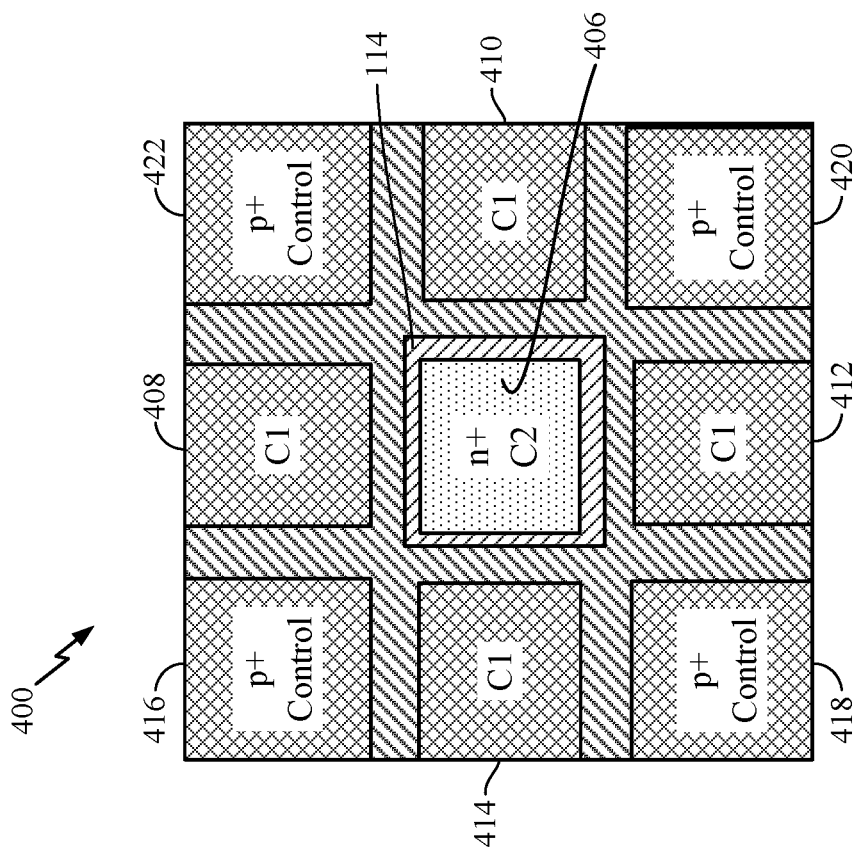

FIG. 4 illustrates top views of example transcap structures 400 and 402, in accordance with certain aspects of the present disclosure. In this case, control regions 416, 418, 420, and 422 are disposed in corner regions of the transcap structure 400, and the C2 non-insulative region 406 is disposed in the middle of the transcap structure 400. In this case, the control regions are aligned with the C1 non-insulative region, but can also be also misaligned in other cases. The transcap structure 400 allows for the C1 non-insulative regions 408, 410, 412, and 414 to be disposed over portions of the semiconductor region 114 that are adjacent to four sides of the non-insulative region 406, increasing capacitance density. In certain aspects, the C1 non-insulative regions 408, 410, 412, and 414, or any combination thereof, may be coupled together. In some cases, the control regions 416, 418, 420, and 422 may be replaced with C2 regions, and the C2 region 406 may be replaced with a control region, as illustrated in the transcap structure 402.

Figure 5:
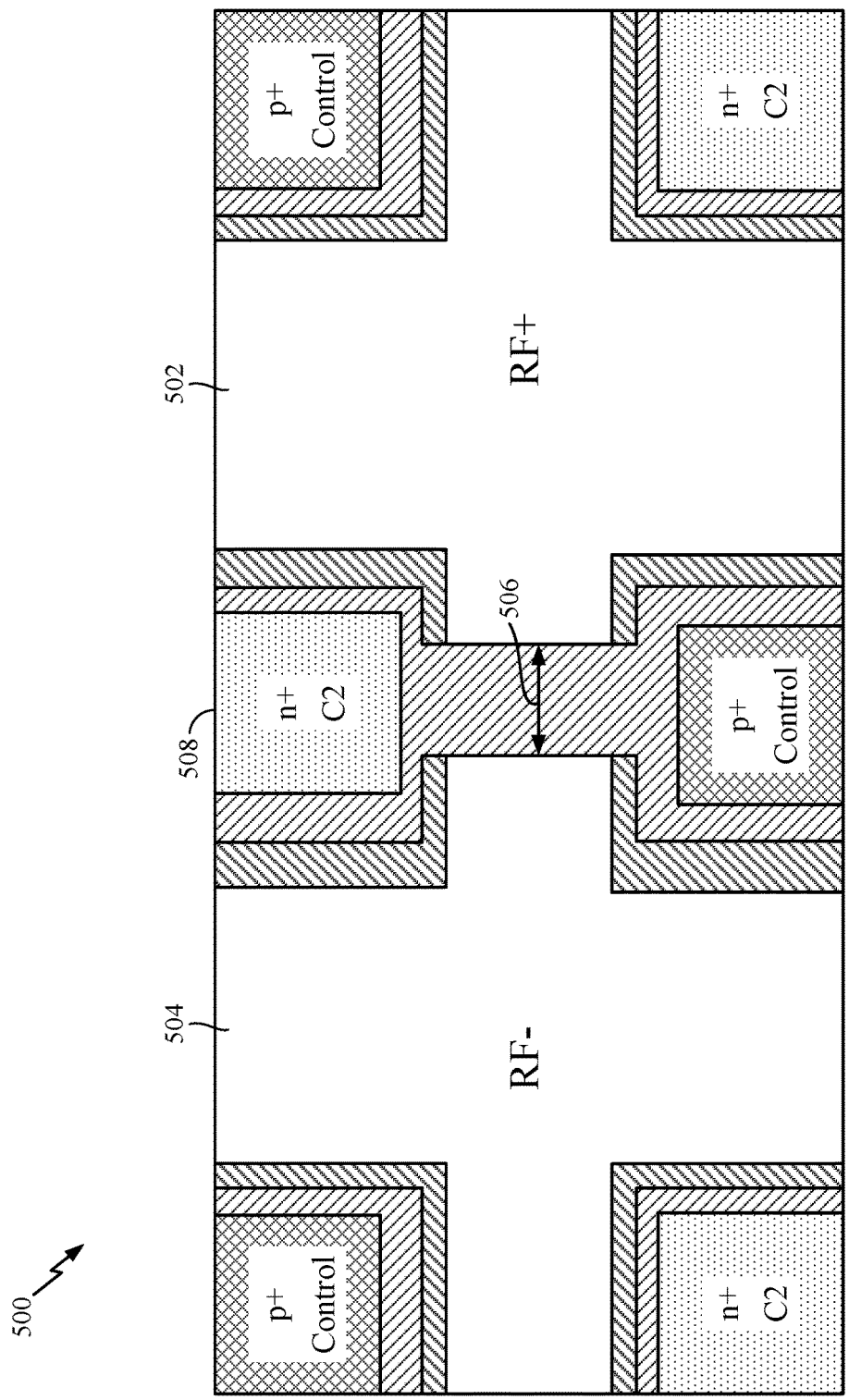
FIG. 5 illustrates a differential semiconductor variable capacitor structure using cross-shaped non-insulative regions, in accordance with certain aspects of the present disclosure.

FIG. 5 illustrates a top view of a differential transcap structure 500 using cross-shaped C1 non-insulative regions 502 and 504, in accordance with certain aspects of the present disclosure. In this case, similar to the transcap structure 300 of FIG. 3 where a cross-shaped C1 non-insulative region 112 was used, each of the C1 non-insulative regions 502 and 504 for the RF+ and RF− terminals may be cross-shaped. A gap 506 may be formed between the C1 non-insulative regions 502 and 504, as illustrated. In certain aspects, the size of the gap 506 may be determined based on parasitic extraction (e.g., the parasitic effects due to both the differential transcap structure 500 and wiring interconnects to the transcap device). With the differential transcap structure 500, the quality factor may be less dependent on the distance between the C1 non-insulative regions 502 and 504 as compared to conventional designs, due to the presence of a C2 non-insulative region 508. As illustrated, the transcap structure 500 may be implemented with two transcaps in accordance with FIG. 3 coupled back to back, but with the gap 506 formed between the C1 non-insulative regions 502 and 504.

Figure 6:
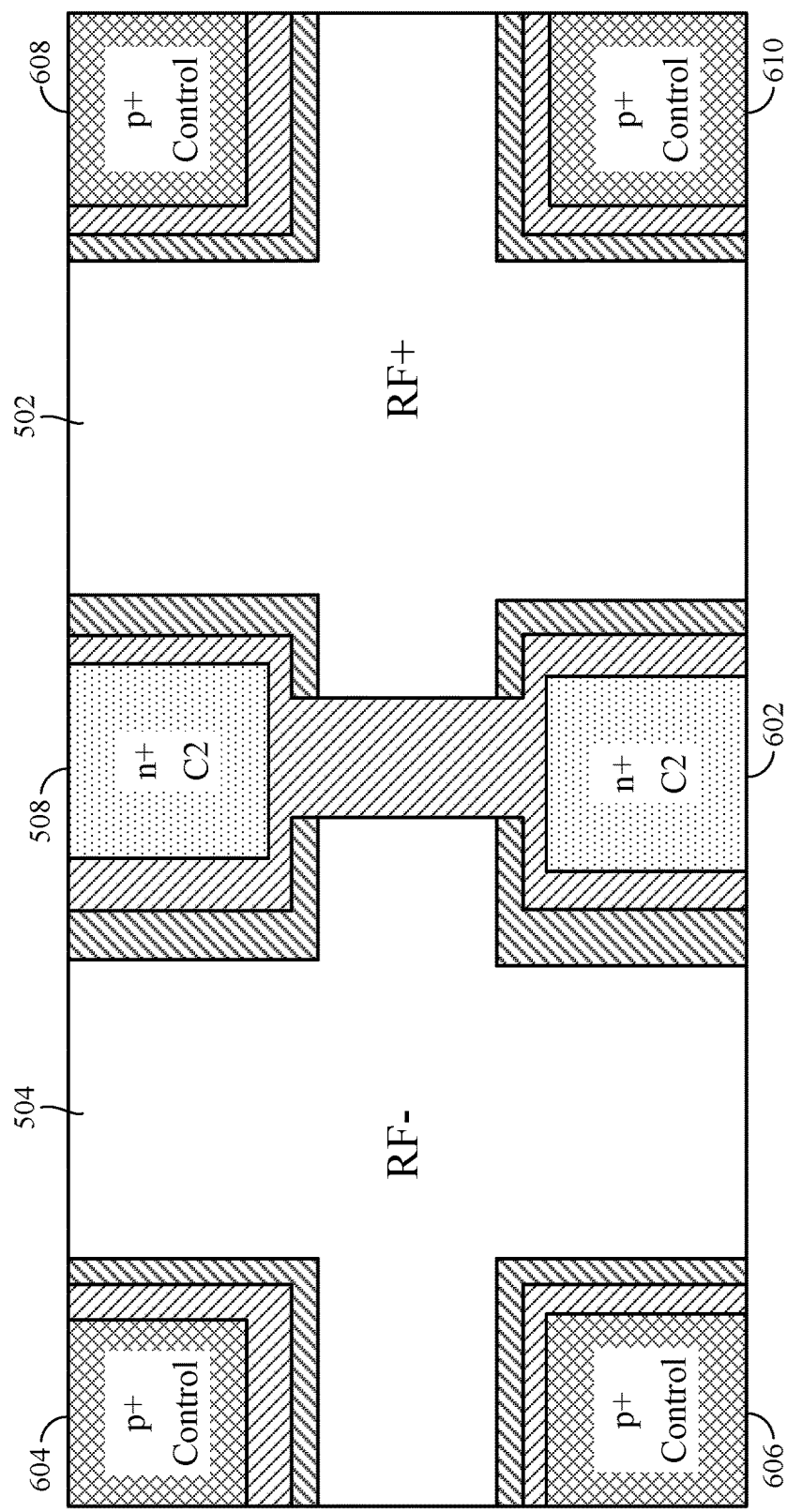
FIG. 6 illustrates a differential semiconductor variable capacitor structure with multiple non-insulative regions between non-insulative regions, in accordance with certain aspects of the present disclosure.

FIG. 6 illustrates a top view of a differential transcap structure 600 with multiple C2 non-insulative regions 508 and 602 between the C1 non-insulative regions 502 and 504, in accordance with certain aspects of the present disclosure. In this case, the control regions 604, 606, 608, and 610 may be disposed at corner regions of the differential transcap structure 600.

Figure 7:
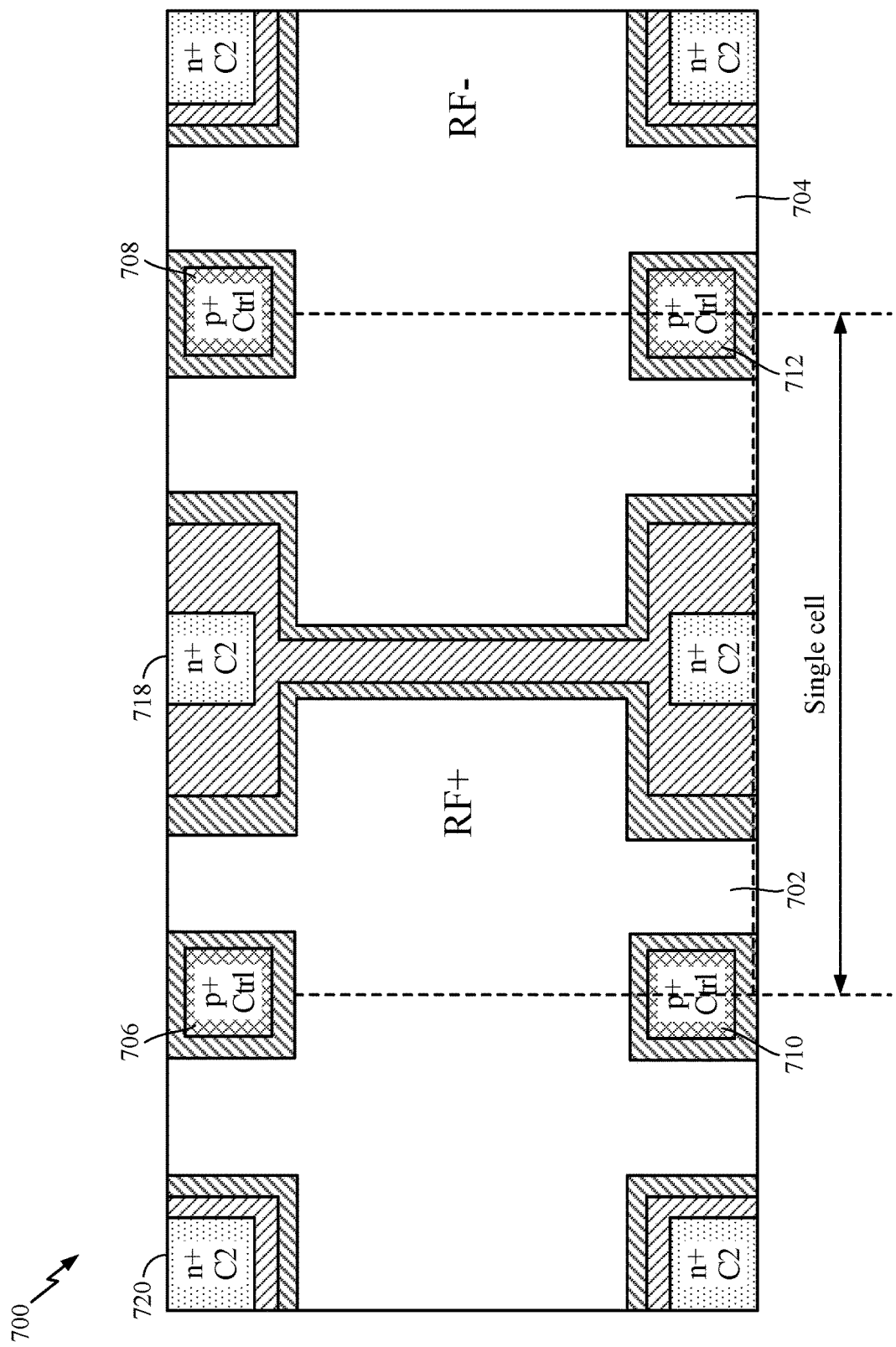
FIG. 7 illustrates a multi-finger differential semiconductor variable capacitor structure, in accordance with certain aspects of the present disclosure.

FIG. 7 illustrates a top view of an interdigitated differential transcap structure 700, in accordance with certain aspects of the present disclosure. In this case, control regions 706, 708, 710, and 712 may be disposed such that the C1 non-insulative regions 702 and 704 are disposed adjacent to at least three sides of the control regions 706, 710, 708 and 712.

Figure 8:
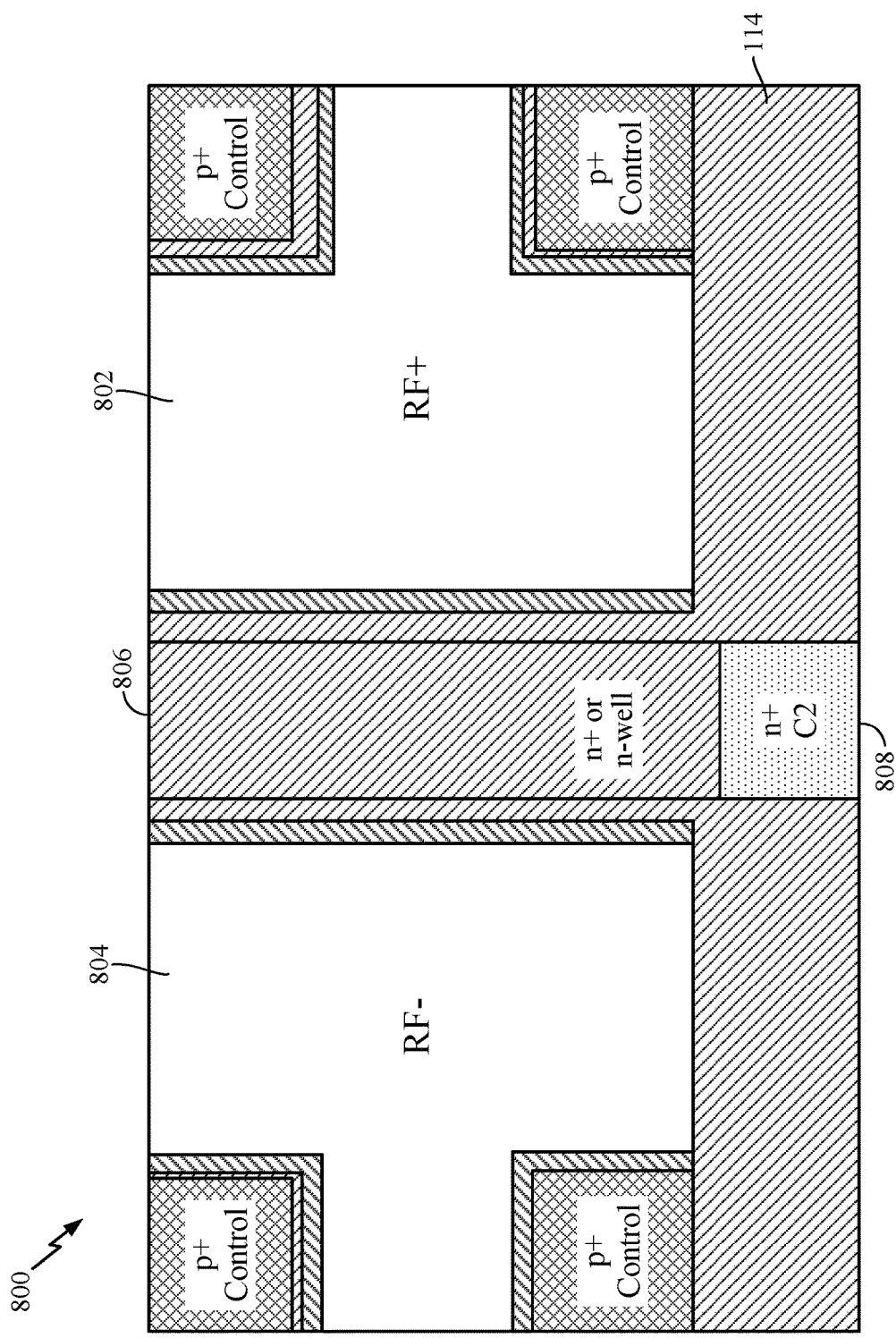
FIG. 8 illustrates a differential semiconductor variable capacitor structure using "T"-shaped non-insulative regions, in accordance with certain aspects of the present disclosure.

FIG. 8 illustrates a top view of a differential transcap structure 800 using "T"-shaped C1 non-insulative regions 802 and 804, in accordance with certain aspects of the present disclosure. As illustrated, a non-insulative region 806 (e.g., n-well or n+ region) may be disposed adjacent to the C2 non-insulative region 808 and at a middle portion of the semiconductor region 114, allowing the C2 non-insulative region to more effectively control the capacitance of the transcap device. Is should be noted that the size of the n+ region can impact the C-V characteristic of the transcap structure 800.

Figure 9:
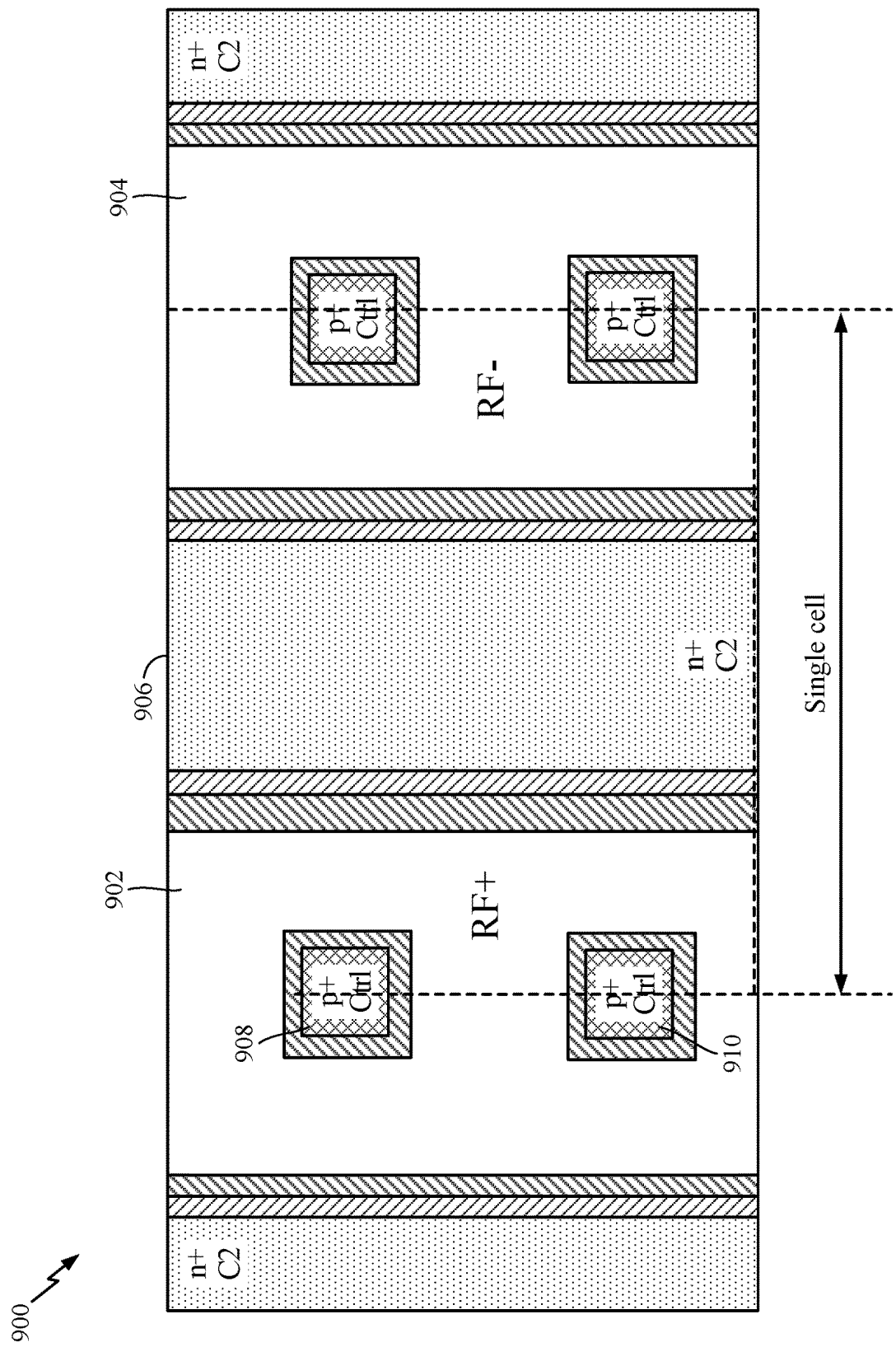
FIG. 9 illustrates a differential semiconductor variable capacitor structure with non-insulative regions disposed above portions of the semiconductor region that surround one or more control regions, in accordance with certain aspects of the present disclosure.

FIG. 9 illustrates a top view of a differential transcap structure 900 with C1 non-insulative regions 902 and 904 disposed above portions of the semiconductor region that surround one or more control regions, in accordance with certain aspects of the present disclosure. For example, the C1 non-insulative region 902 is disposed above portions of the semiconductor region 114 that surround control regions 908 and 910. In certain aspects, a C2 non-insulative region 906 may be disposed in the middle of the differential transcap structure 900, as illustrated.

Figure 10:
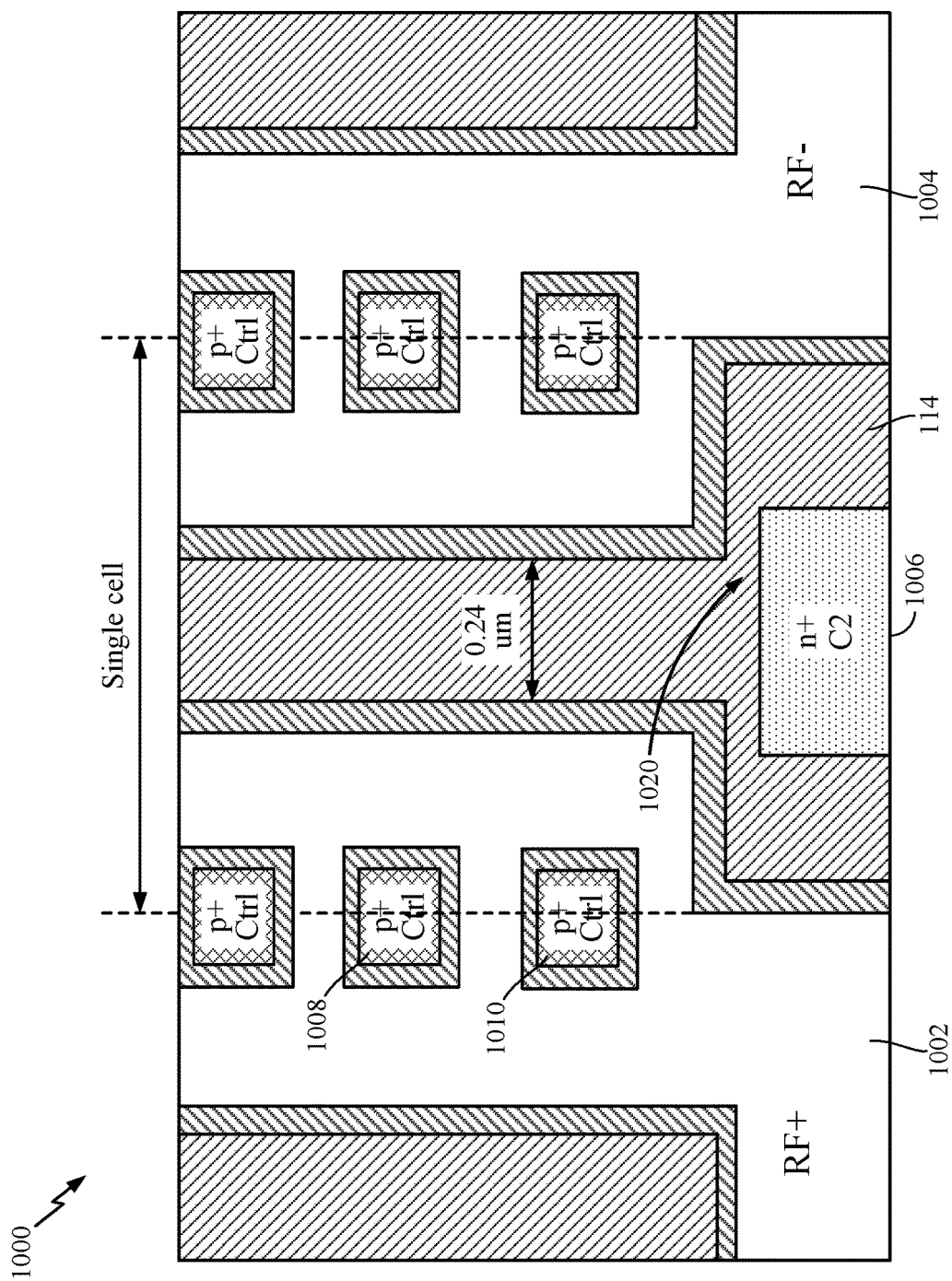
FIG. 10 illustrates a differential semiconductor variable capacitor structure implemented with a non-insulative region disposed in a middle portion of the semiconductor variable capacitor structure, in accordance with certain aspects of the present disclosure.

FIG. 10 illustrates a top view of a differential transcap structure 1000 implemented with a single C2 non-insulative region 1006, in accordance with certain aspects of the present disclosure. Similar to FIG. 9, the C1 non-insulative regions are disposed above portions of the semiconductor region that surround one or more control regions (e.g., control regions 1008 and 1010). In this case, the C1 non-insulative regions 1002 and 1004 for the respective RF+ and RF− terminals are disposed above portions of the semiconductor region 114 that are adjacent to a same side 1020 of the C2 non-insulative 1006.

Figure 11:
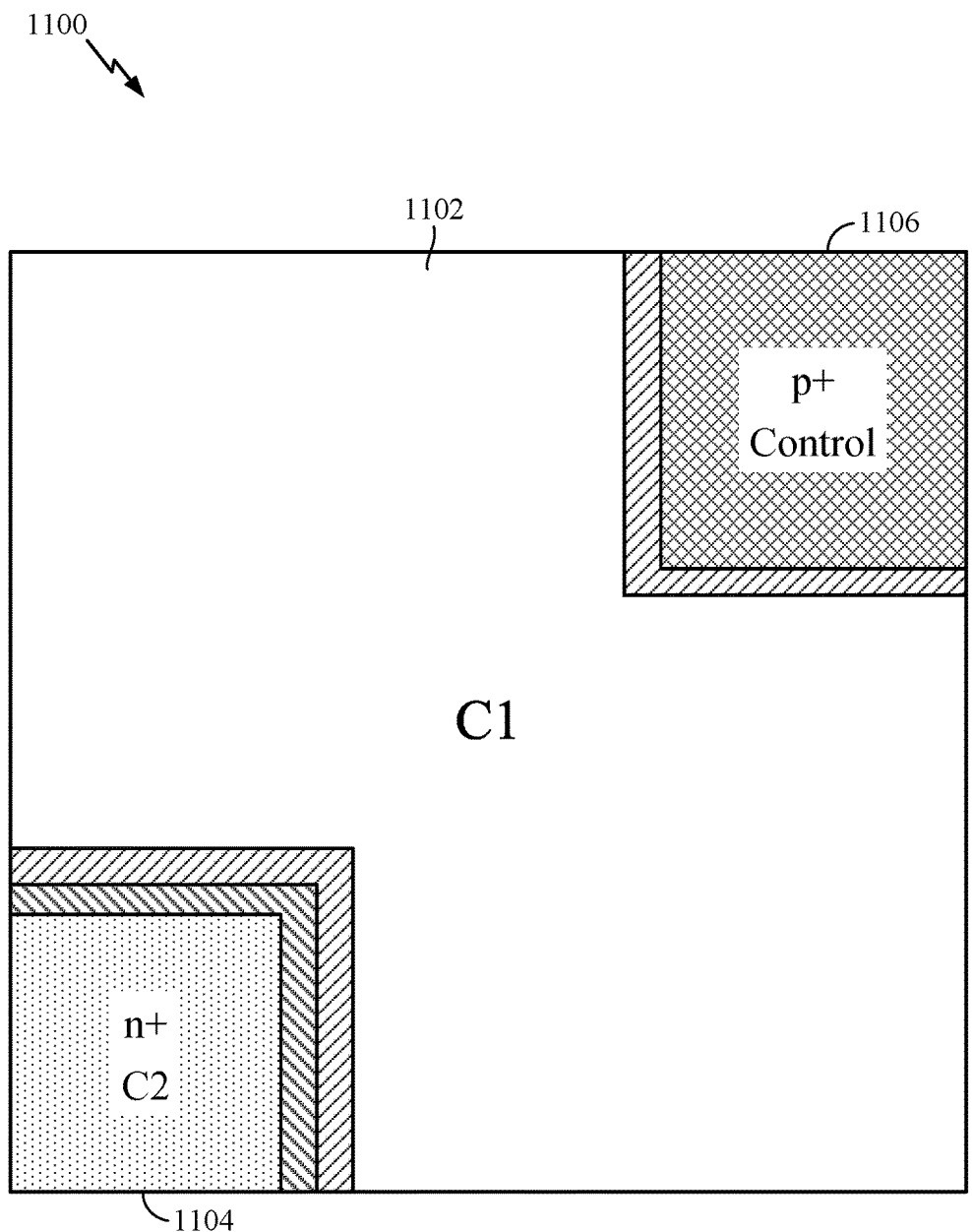
FIG. 11 illustrates a semiconductor variable capacitor structure implemented using a ribbon-shaped non-insulative region, in accordance with certain aspects of the present disclosure.

FIG. 11 illustrates a top view of a transcap structure 1100 implemented using a ribbon-shaped (e.g., like a bow-tie) C1 non-insulative region 1102, in accordance with certain aspects of the present disclosure. The transcap structure 1100 includes a control region 1106 and a C2 non-insulative region 1104 disposed in corner regions of the transcap structure 1100.

Figure 12:
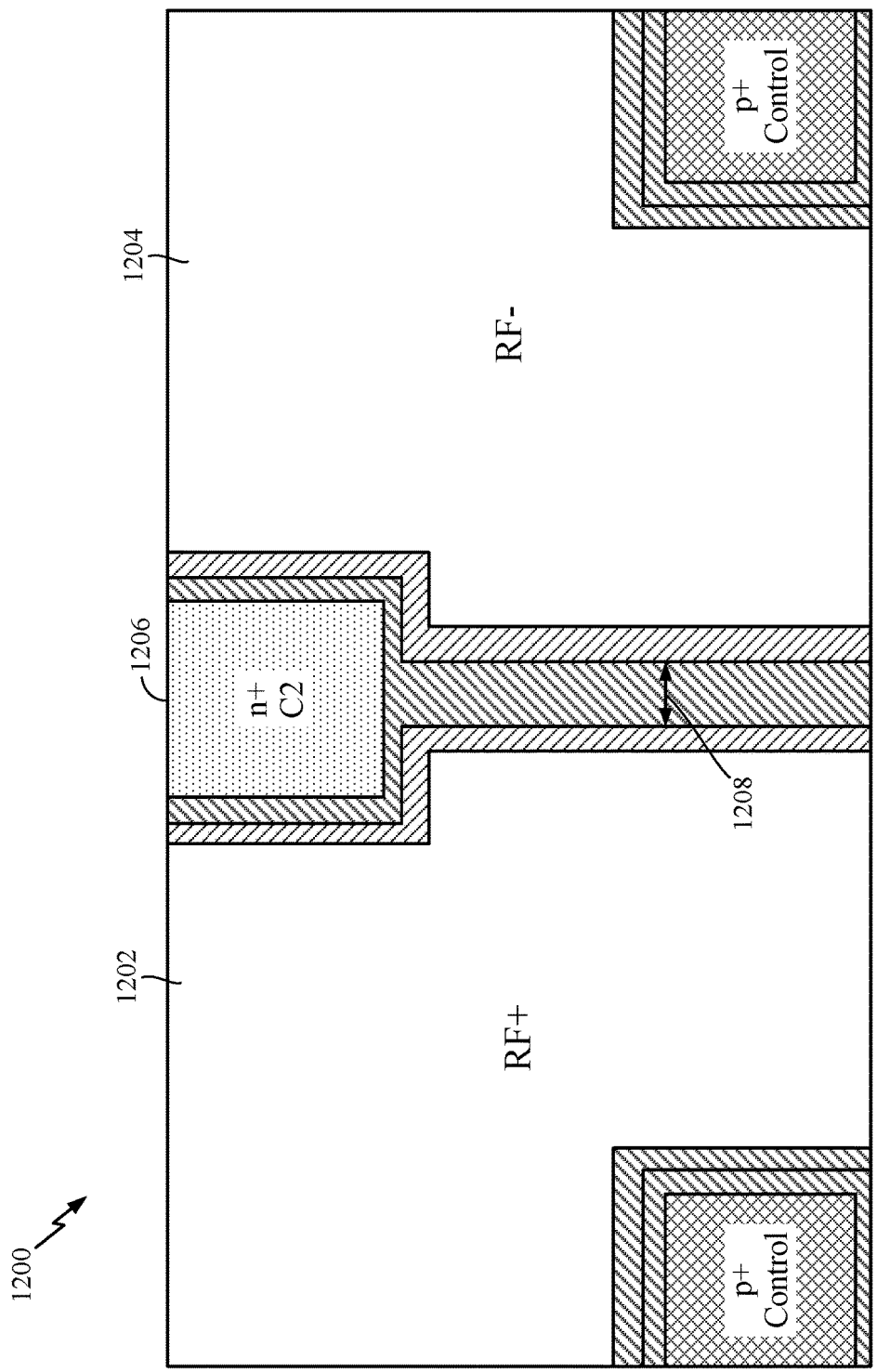
FIG. 12 illustrates a differential semiconductor variable capacitor structure using ribbon-shaped non-insulative regions, in accordance with certain aspects of the present disclosure.

FIG. 12 illustrates a top view of a differential transcap structure 1200 using ribbon-shaped C1 non-insulative regions 1202 and 1204, in accordance with certain aspects of the present disclosure. As illustrated, the C2 non-insulative region 1206 may be disposed between the C1 non-insulative regions 1202 and 1204, and a gap 1208 may be formed between the C1 non-insulative regions 1202 and 1204.

Figure 13:
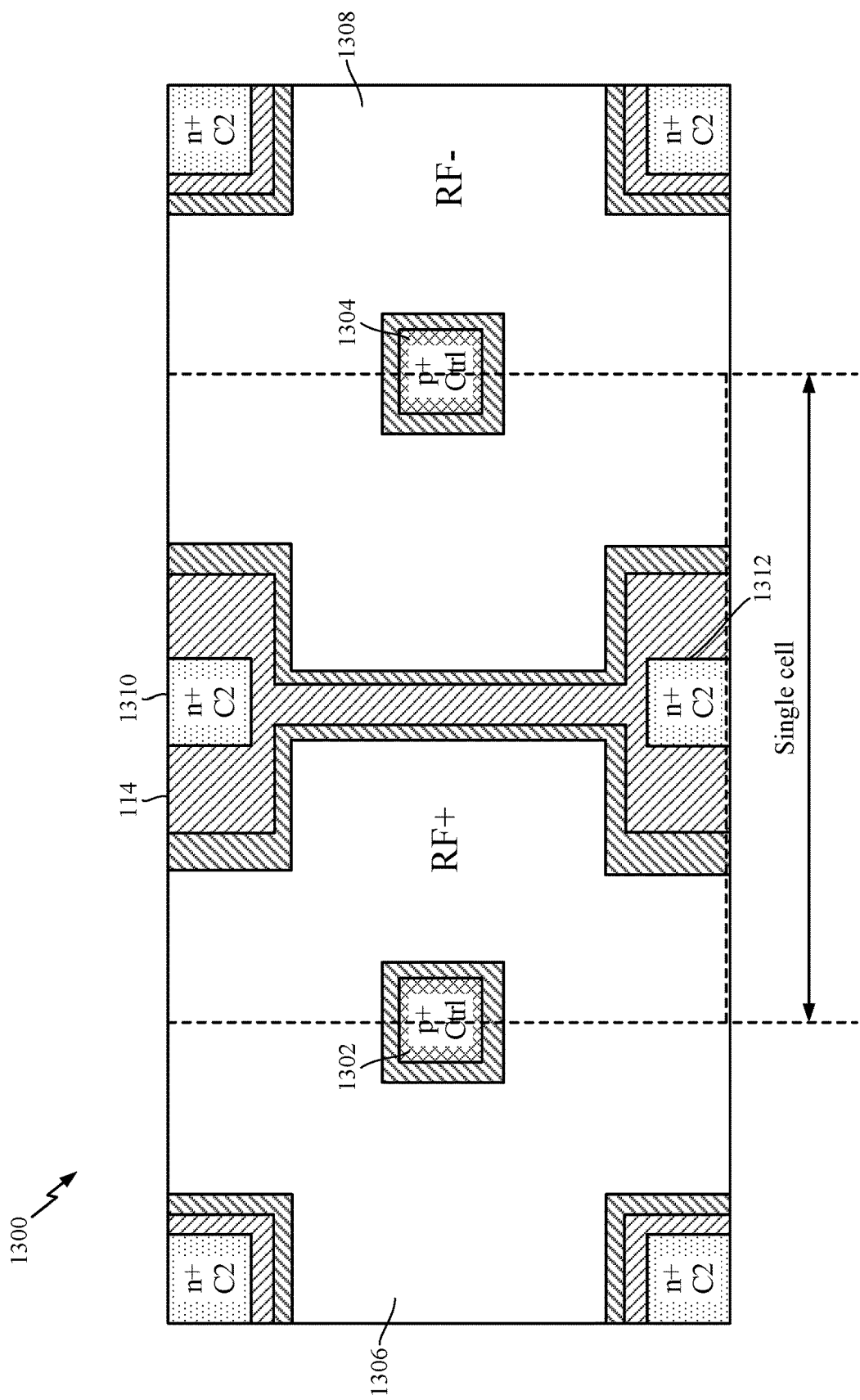
FIG. 13 illustrates a multi-fingered differential semiconductor variable capacitor structure, in accordance with certain aspects of the present disclosure.

FIG. 13 illustrates a top view of an interdigitated multi-fingered differential transcap structure 1300, in accordance with certain aspects of the present disclosure. The differential transcap structure 1300 illustrates a single cell that can be replicated to obtain a series of transcap devices connected in parallel. As illustrated, the control regions 1302 and 1304 are surrounded by portions of the semiconductor region 114 over which the C1 non-insulative regions 1306 and 1308 are formed. The C2 non-insulative regions 1310 and 1312 are disposed between the C1 non-insulative regions 1306 and 1308 from the top-down perspective of FIG. 13.

Figure 14:
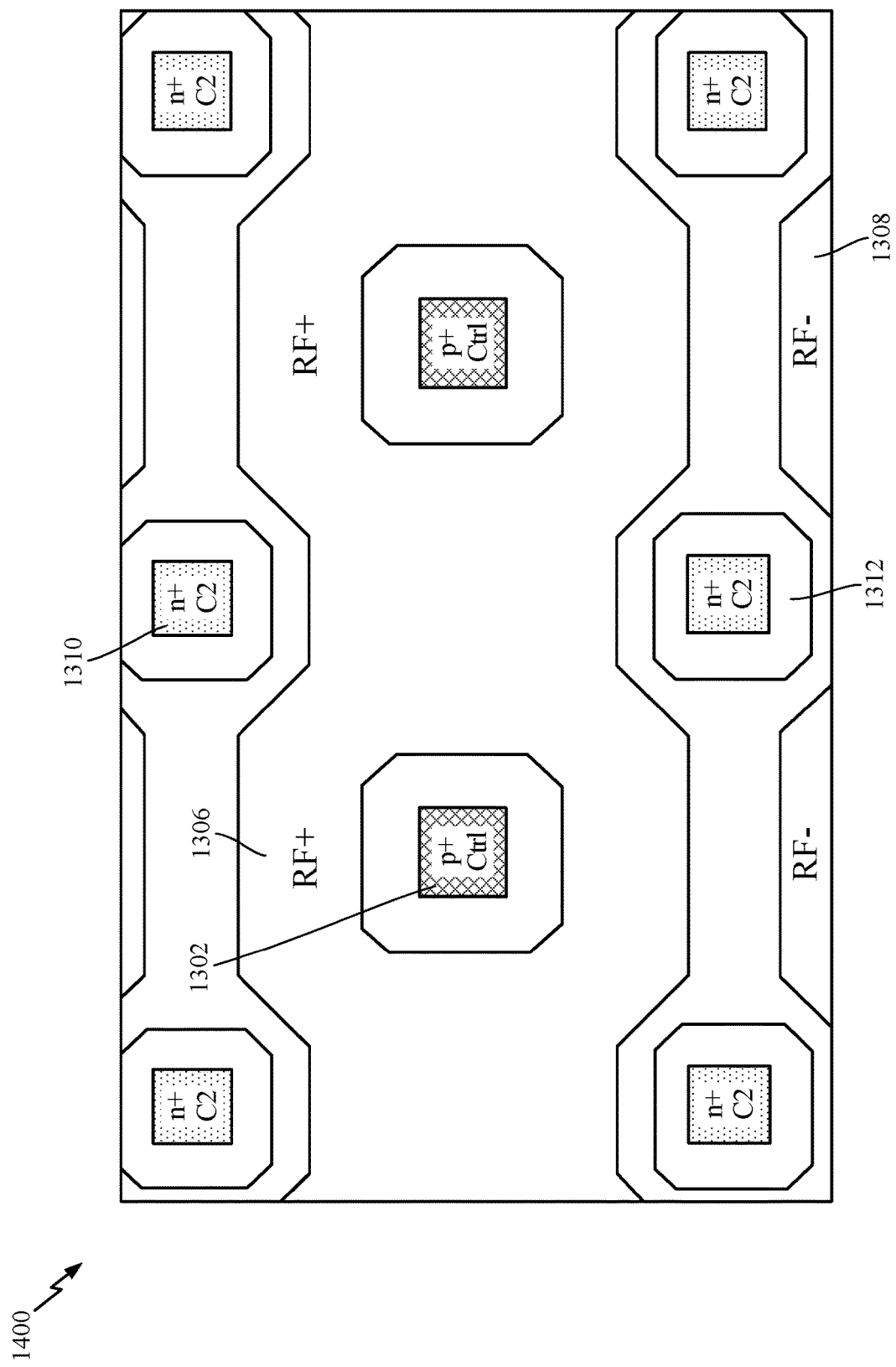
FIG. 14 illustrates an example implementation of the multi-fingered differential semiconductor variable capacitor structure, in accordance with certain aspects of the present disclosure.

FIG. 14 illustrates a top view of an example implementation of the multi-fingered differential transcap structure 1300, in accordance with certain aspects of the present disclosure. As viewed from the top-down, the control region 1302 is disposed in the middle of the C1 non-insulative region 1306. The C2 regions 1310 and 1312 are disposed in the corner regions of the C1 non-insulative regions 1306 and 1308 as viewed from the top-down.

Figure 15:
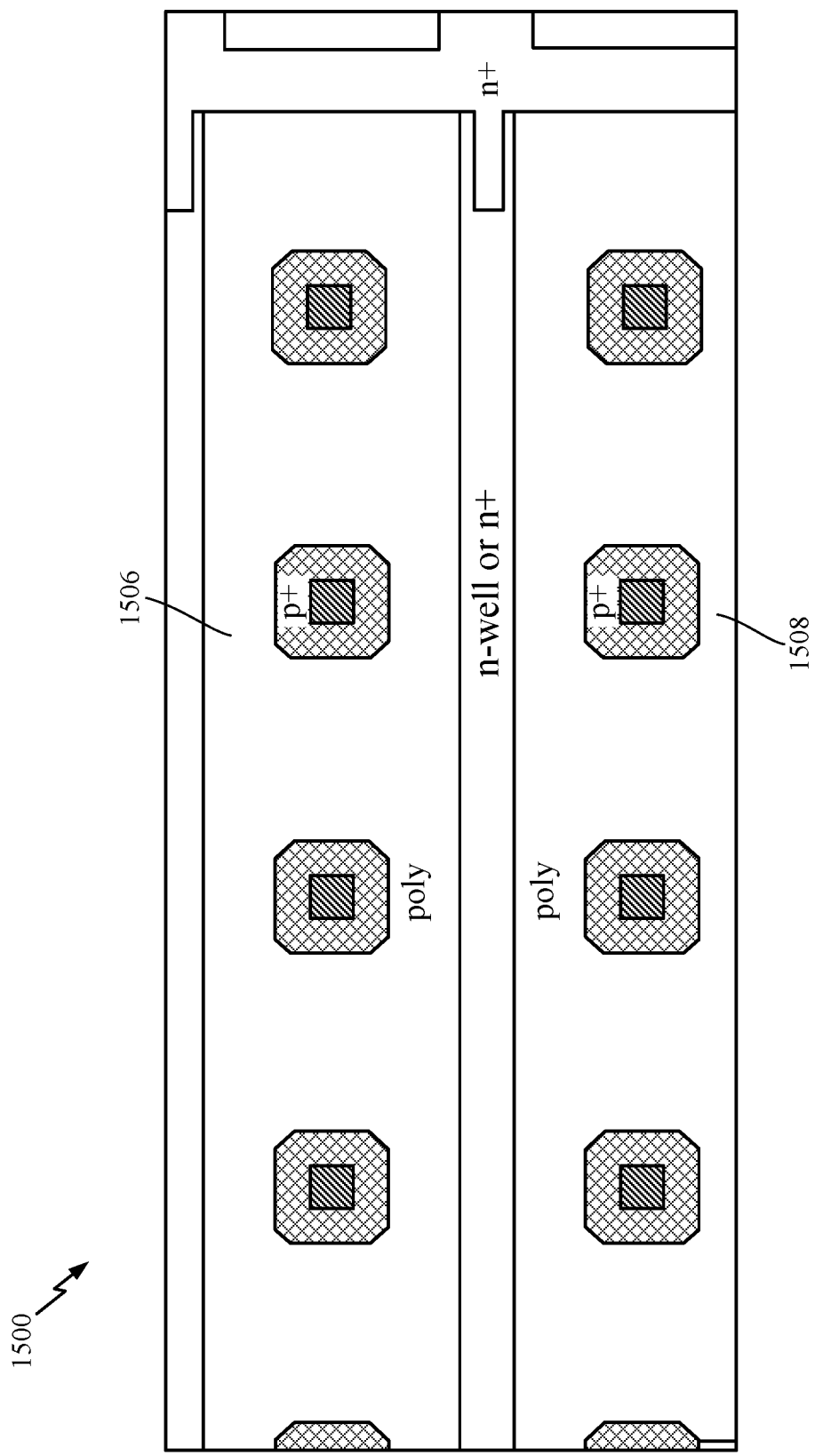
FIG. 15 illustrates an example implementation of a multi-fingered differential semiconductor variable capacitor structure having a straight-line separation between non-insulative regions, in accordance with certain aspects of the present disclosure.

FIG. 15 illustrates a top view of an example implementation of a multi-fingered differential transcap structure 1500, in accordance with certain aspects of the present disclosure. In this case, the C1 non-insulative regions 1506 and 1508 are separated by n-well or n+ regions that may be used as a C2 non-insulative region. For example, pockets of n+ or n-well can be alternated to maintain a straight line (or close to a straight line) separation between the C1 non-insulative regions 1506 and 1508.

Figure 16:
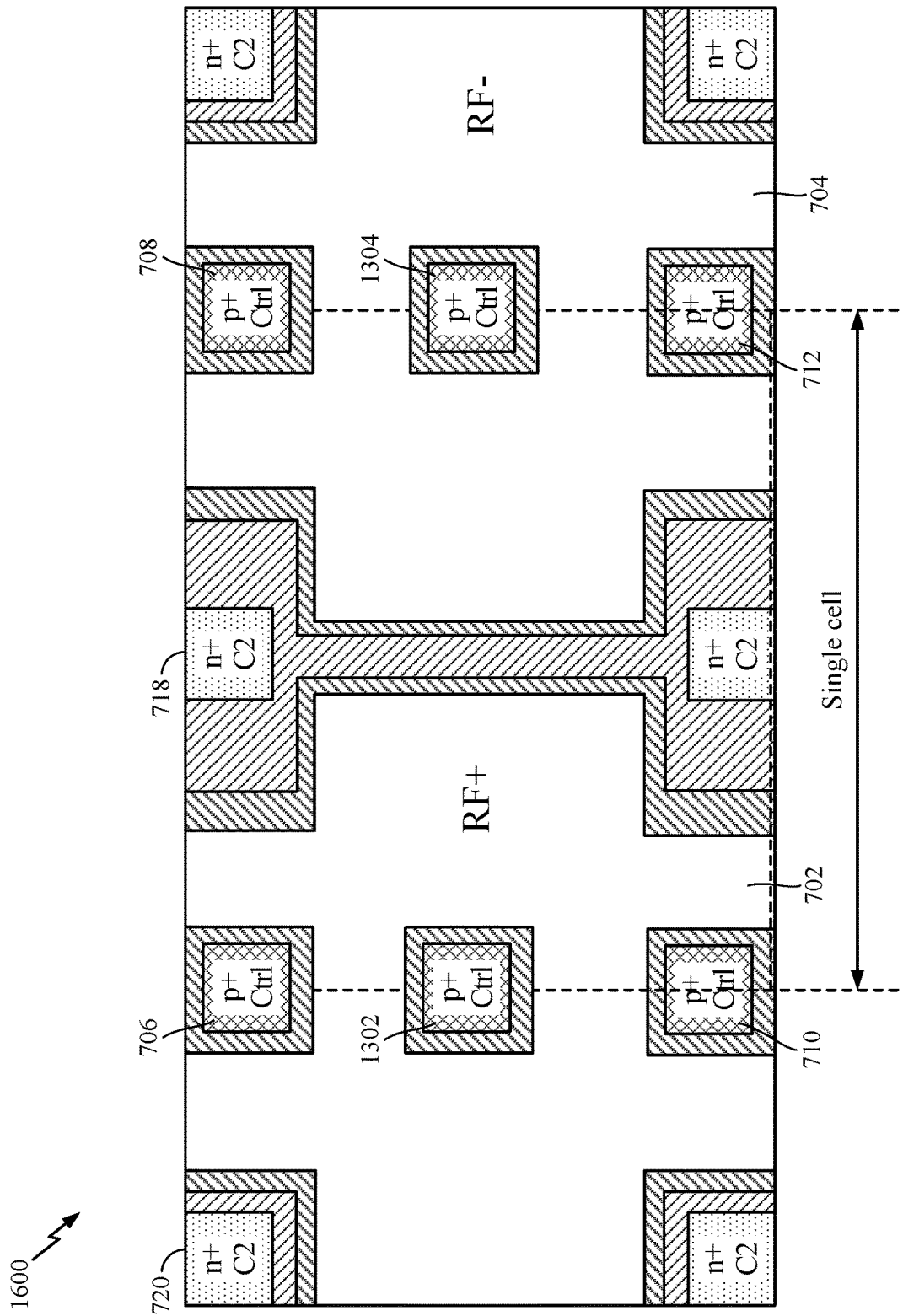
FIG. 16 illustrates the multi-fingered differential semiconductor variable capacitor structure of FIG. 13 with additional control regions, in accordance with certain aspects of the present disclosure.

FIG. 16 illustrates a top view of a multi-fingered differential transcap structure 1600, in accordance with certain aspects of the present disclosure. In this case, similar to FIG. 7, control regions 706, 708, 710, and 712 are disposed between C2 non-insulative regions. For example, the control region 706 is disposed between the C2 non-insulative regions 718 and 720. Moreover, as viewed from the top-down, control regions 1302 and 1304 are disposed in the middle of the C1 non-insulative regions 702 and 704, similar to FIG. 13.

Figure 17:
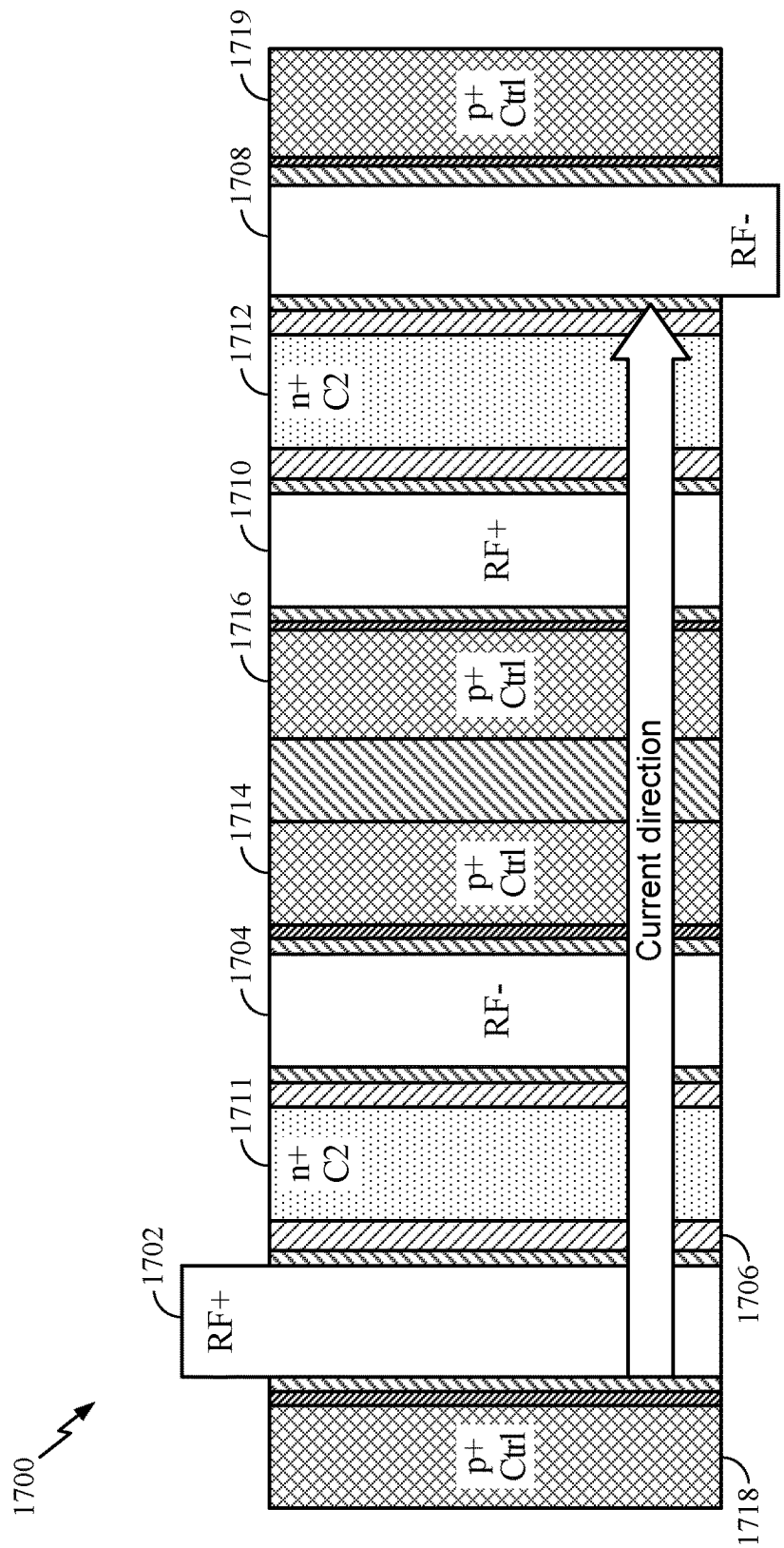
FIG. 17 illustrates an example interdigitated differential semiconductor variable capacitor structure, in accordance with certain aspects of the present disclosure.

FIG. 17 illustrates a top view of an example interdigitated stacked differential transcap structure 1700, in accordance with certain aspects of the present disclosure. The differential transcap structure 1700 is implemented by connecting in series two differential series transcap devices. For example, a first differential series transcap device is implemented using C1 non-insulative regions 1702 and 1704 disposed over a semiconductor region 1706, and a C2 non-insulative region 1711 disposed above the semiconductor region 1706 and between the non-insulative regions 1702 and 1704 as viewed from the top-down. A second differential series transcap device is implemented using C1 non-insulative regions 1708 and 1710, and the C2 non-insulative region 1712. In certain aspects, one or more control regions 1714, 1716 may be disposed above the semiconductor region 1706 and between the C1 non-insulative regions 1704 and 1710 as viewed from the top-down. A shallow trench isolation (STI) region may be disposed between the control regions 1714, 1716. In certain aspects, the C1 non-insulative regions 1704 and 1710 may be coupled (e.g., shorted) together, and the C1 non-insulative regions 1702 and 1708 may be coupled to RF+ and RF− terminals, respectively. Thus, the control regions 1714 and 1716 may be used to adjust a capacitance between the RF+ and RF− terminals coupled to the C1 non-insulative regions 1702 and 1708. In some cases, the C1 non-insulative regions 1702 and 1708 may be disposed over portions of the semiconductor region 1706 that are between control regions 1718 and 1719. The differential transcap structure 1700 allows for increased distance between the RF+ and RF− terminals, decreasing parasitic capacitance and with little to no increase in silicon area over conventional implementations. While the example differential transcap structure 1700 is implemented by connecting in series two differential series transcap devices to facilitate understanding, any number of differential series transcap devices may be connected in series.

Figure 18:
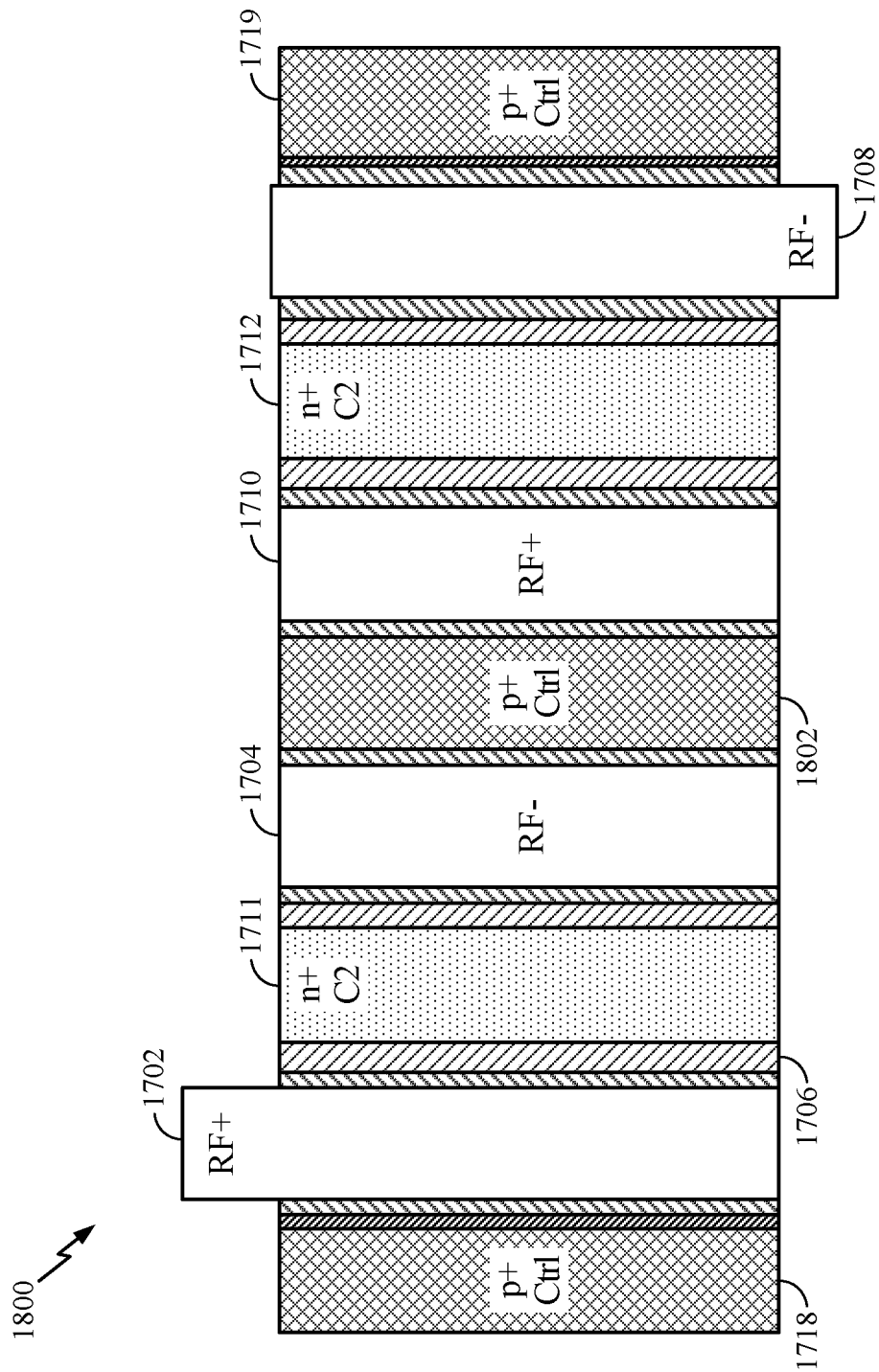
FIG. 18 illustrates an example interdigitated differential semiconductor variable capacitor structure implemented without a shallow trench isolation (STI) region, in accordance with certain aspects of the present disclosure.

FIG. 18 illustrates a top view of an example interdigitated differential transcap structure 1800 implemented without a shallow trench isolation (STI) region, in accordance with certain aspects of the present disclosure. As illustrated, instead of two control regions 1714 and 1716 as in FIG. 17, a single control region 1802 may be disposed in the central region of the transcap structure 1800.

Figure 19:
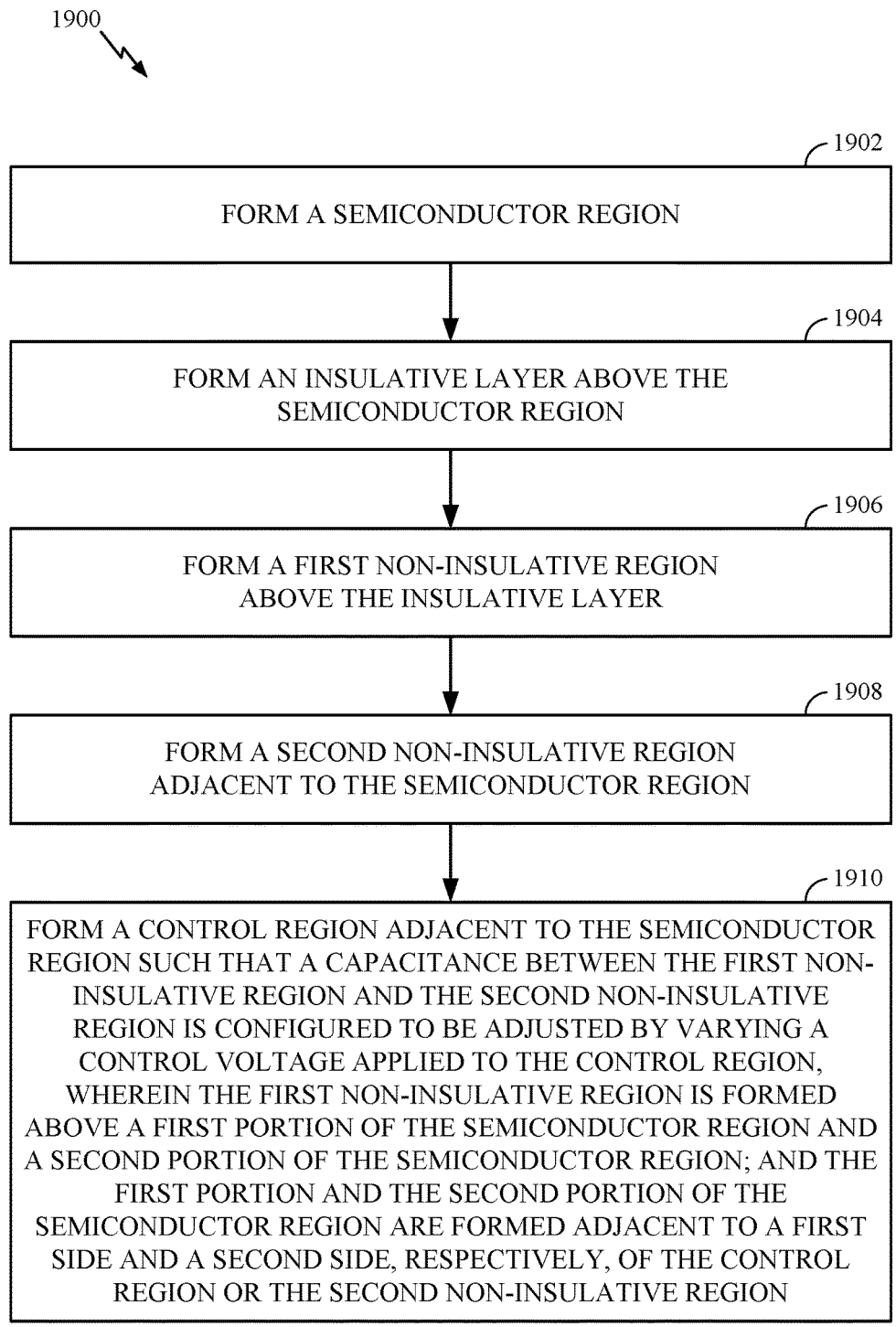
FIG. 19 is a flow diagram of example operations for fabricating a semiconductor variable capacitor, in accordance with certain aspects of the present disclosure.

FIG. 19 is a flow diagram of example operations 1900 for fabricating a semiconductor variable capacitor, in accordance with certain aspects of the present disclosure. The operations 1900 may be performed, for example, by a semiconductor processing chamber.

Operations 1900 may begin at block 1902 by forming a semiconductor region (e.g., semiconductor region 114). At block 1904, an insulative layer (e.g., oxide layer 110) is formed above the semiconductor region, and at block 1906, a first non-insulative region (e.g., the C1 non-insulative region 306) is formed above the insulative layer. At block 1908, a second non-insulative region is formed adjacent to the semiconductor region (e.g., C2 non-insulative region 310). At block 1910, a control region (e.g., control region 312) is formed adjacent to the semiconductor region such that a capacitance between the first non-insulative region and the second non-insulative region is configured to be adjusted by varying a control voltage applied to the control region. In certain aspects, the first non-insulative region is formed above a first portion of the semiconductor region and a second portion of the semiconductor region, and the first portion and the second portion of the semiconductor region are formed adjacent to a first side and a second side, respectively, of the control region or the second non-insulative region.

In certain aspects, the first portion and the second portion of the semiconductor region are formed adjacent to the first side and the second side of the control region, respectively. In this case, the first non-insulative region is formed above a third portion of the semiconductor region and a fourth portion of the semiconductor region, and the third portion and the fourth portion of the semiconductor region are formed adjacent to the first side and the second side of the second non-insulative region, respectively.

In certain aspects, the first portion and the second portion of the semiconductor region are formed adjacent to the first side and the second side of the control region, respectively. In this case, the first non-insulative region is formed above a third portion of the semiconductor region and a fourth portion of the semiconductor region, and the third portion and the fourth portion of the semiconductor region are formed adjacent to a third side and a fourth side of the control region, respectively. In certain aspects, the operations 1900 also include forming another control region (e.g., control region 312) adjacent to the semiconductor region such that a capacitance between the first non-insulative region and the second non-insulative region is configured to be adjusted by varying another control voltage applied to the other control region. In this case, the first non-insulative region is formed above a fifth portion of the semiconductor region and a sixth portion of the semiconductor region, and the fifth portion and the sixth portion of the semiconductor region are formed adjacent to a first side and a second side of the other control region, respectively.

In certain aspects, the operations 1900 include forming another insulative layer above the semiconductor region, forming a third non-insulative region (e.g., above the other insulative layer, and forming another control region adjacent to the semiconductor region such that a capacitance between the second non-insulative region and the third non-insulative region is configured to be adjusted by varying another control voltage applied to the other control region. In this case, the third non-insulative region may be formed above a fifth portion of the semiconductor region and a sixth portion of the semiconductor region, and the fifth portion and the sixth portion of the semiconductor region may be formed adjacent to a first side and a second side of the other control region, respectively. In certain aspects, the second non-insulative region is formed between the control region and the other control region.

In certain aspects, the operations 1900 also include forming another insulative layer above the semiconductor region and forming a third non-insulative region above the other insulative layer. In certain aspects, another control region may be formed adjacent to the semiconductor region such that a capacitance between the second non-insulative region and the third non-insulative region is configured to be adjusted by varying another control voltage applied to the other control region. In this case, the third non-insulative region may be formed above a third portion of the semiconductor region, and the first portion of the semiconductor region may be formed adjacent to a portion of the first side of the control region or the second non-insulative region. In some cases, the third portion of the semiconductor region may be formed adjacent to another portion of the first side of the control region or the second non-insulative region.

In certain aspects, the operations 1900 also include forming a fourth non-insulative region adjacent to the semiconductor region. In this case, the first non-insulative region is formed above a fourth portion of the semiconductor region, the third non-insulative region is formed above a fifth portion of the semiconductor region, the fourth portion of the semiconductor region is formed adjacent to a portion of the first side of the fourth non-insulative region, and the fifth portion of the semiconductor region is formed adjacent to another portion of the first side of the fourth non-insulative region.

In certain aspects, the operations 1900 also include forming another insulative layer above the semiconductor region, forming a third non-insulative region above the other insulative layer, and forming another control region adjacent to the semiconductor region such that a capacitance between the second non-insulative region and the third non-insulative region is configured to be adjusted by varying another control voltage applied to the other control region. In this case, the third non-insulative region is formed above a third portion of the semiconductor region, the first portion and the second portion of the semiconductor region are formed adjacent to the first side and the second side of the control region, and the third portion of the semiconductor region is formed adjacent to a corner portion of the second non-insulative region.

Figure 20:
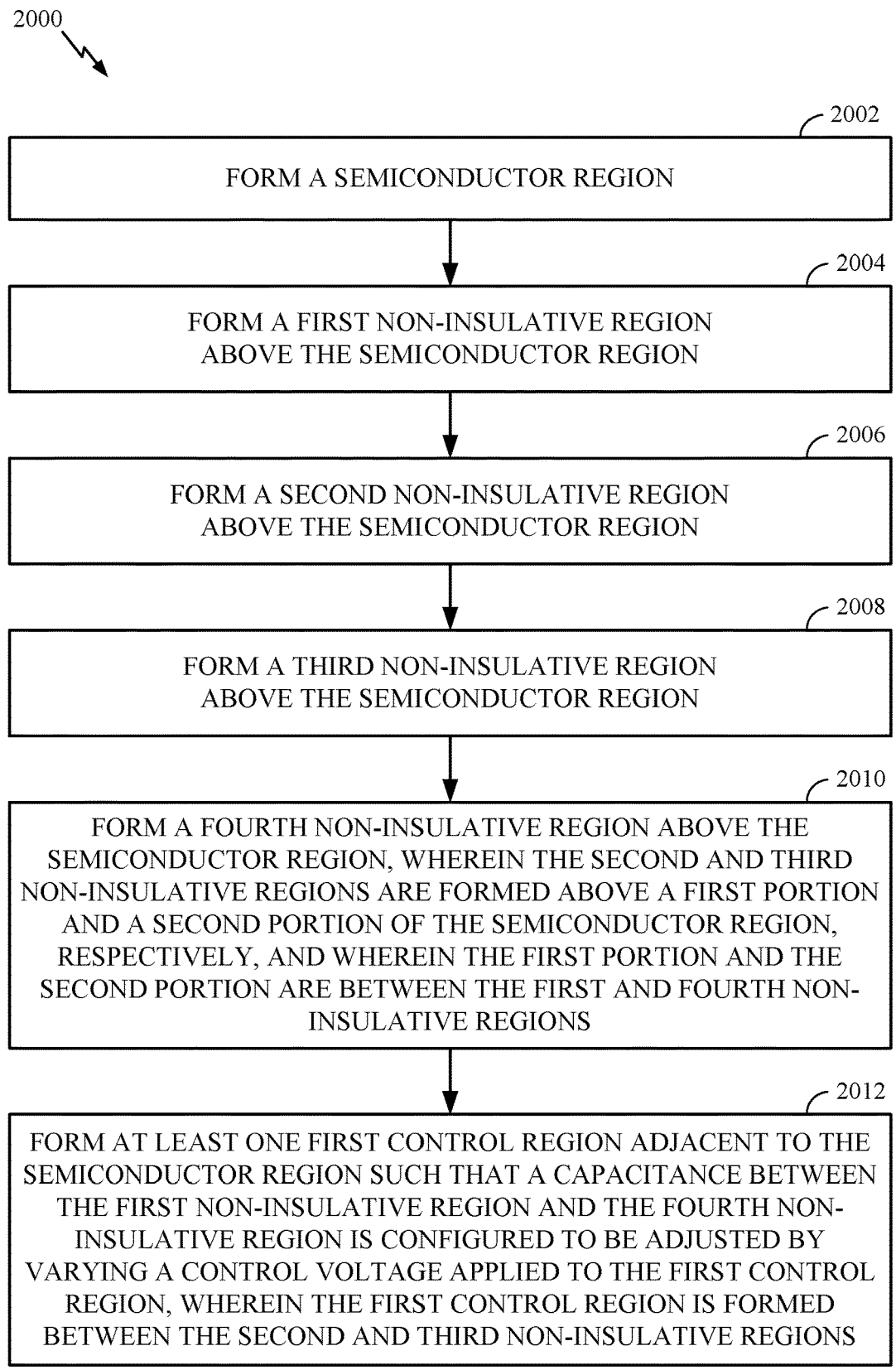
FIG. 20 is a flow diagram of example operations for fabricating an interdigitated differential semiconductor variable capacitor, in accordance with certain aspects of the present disclosure.

FIG. 20 is a flow diagram of example operations 2000 for fabricating a semiconductor variable capacitor, in accordance with certain aspects of the present disclosure. The operations 2000 may be performed, for example, by a semiconductor processing chamber.

Operations 2000 may begin at block 2002 by forming a semiconductor region (e.g., semiconductor region 1706 of FIG. 17). At block 2004, a first non-insulative region (e.g., C1 non-insulative region 1702) is formed above the semiconductor region, and at block 2006, a second non-insulative region (e.g., C1 non-insulative region 1704) is formed above the semiconductor region. At block 2008, a third non-insulative region (e.g., C1 non-insulative region 1710) is formed above the semiconductor region, and at block 2010, a fourth non-insulative region (e.g., C1 non-insulative region 1708) is formed above the semiconductor region. In certain aspects, the second and third non-insulative regions are formed above a first portion and a second portion of the semiconductor region, respectively, and the first portion and the second portion may be between the first and fourth non-insulative regions. In certain aspects, at block 2010, at least one first control region (e.g., control region 1714) may be formed adjacent to the semiconductor region such that a capacitance between the first non-insulative region and the fourth non-insulative region is configured to be adjusted by varying a control voltage applied to the first control region. In certain aspects, the first control region may be formed between the second and third non-insulative regions.

The operations 2000 may also include shorting the second non-insulative region to the third non-insulative region. In certain aspects, the operations 2000 may also include forming a second control region (e.g., control region 1718), and forming a third control region (e.g., control region 1719), wherein the first and fourth non-insulative regions are formed above portions of the semiconductor region that are between the second and third control regions. In certain aspects, the at least one first control region comprises a plurality of control regions formed between the second and third non-insulative regions.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor variable capacitor comprising:
   a semiconductor region;
   an insulative layer disposed above the semiconductor region;
   a first non-insulative region disposed above the insulative layer;
   a second non-insulative region disposed adjacent to the semiconductor region; and
   a control region disposed adjacent to the semiconductor region such that a capacitance between the first non-insulative region and the second non-insulative region is configured to be adjusted by varying a control voltage applied to the control region, wherein:
      the first non-insulative region is disposed above a first portion of the semiconductor region and a second portion of the semiconductor region;
      the control region or the second non-insulative region comprises a first side and a second side;
      the first portion and the second portion of the semiconductor region are disposed adjacent to the first side and the second side, respectively; and
      the first side is perpendicular to the second side with respect to a top view, and the first portion being adjacent to the first side with respect to the top view, and the second portion being adjacent to the second side with respect to the top view.

2. The semiconductor variable capacitor of claim 1, wherein:
   the first portion and the second portion of the semiconductor region are disposed adjacent to the first side and the second side of the control region, respectively;
   the first non-insulative region is disposed above a third portion of the semiconductor region and a fourth portion of the semiconductor region; and
   the third portion and the fourth portion of the semiconductor region are disposed adjacent to the first side and the second side of the second non-insulative region, respectively.

3. The semiconductor variable capacitor of claim 1, wherein:
   the first portion and the second portion of the semiconductor region are disposed adjacent to the first side and the second side of the control region, respectively;
   the first non-insulative region is disposed above a third portion of the semiconductor region and a fourth portion of the semiconductor region; and
   the third portion and the fourth portion of the semiconductor region are disposed adjacent to a third side and a fourth side of the control region, respectively.

4. The semiconductor variable capacitor of claim 3, further comprising:
   another control region disposed adjacent to the semiconductor region such that a capacitance between the first non-insulative region and the second non-insulative region is configured to be adjusted by varying another control voltage applied to the other control region, wherein:
      the first non-insulative region is disposed above a fifth portion of the semiconductor region and a sixth portion of the semiconductor region; and
      the fifth portion and the sixth portion of the semiconductor region are disposed adjacent to a first side and a second side of the other control region, respectively.

5. The semiconductor variable capacitor of claim 3, further comprising:
   another insulative layer disposed above the semiconductor region;
   a third non-insulative region disposed above the other insulative layer; and
   another control region disposed adjacent to the semiconductor region such that a capacitance between the second non-insulative region and the third non-insulative region is configured to be adjusted by varying another control voltage applied to the other control region, wherein:
      the third non-insulative region is disposed above a fifth portion of the semiconductor region and a sixth portion of the semiconductor region; and
      the fifth portion and the sixth portion of the semiconductor region are disposed adjacent to a first side and a second side of the other control region, respectively.

6. The semiconductor variable capacitor of claim 5, wherein the second non-insulative region is disposed between the control region and the other control region.

7. The semiconductor variable capacitor of claim 1, further comprising:
   another insulative layer disposed above the semiconductor region;
   a third non-insulative region disposed above the other insulative layer; and
   another control region disposed adjacent to the semiconductor region such that a capacitance between the second non-insulative region and the third non-insulative region is configured to be adjusted by varying another control voltage applied to the other control region, wherein:
the third non-insulative region is disposed above a third portion of the semiconductor region;
the first portion of the semiconductor region is disposed adjacent to a portion of the first side of the control region or the second non-insulative region; and
the third portion of the semiconductor region is disposed adjacent to another portion of the first side of the control region or the second non-insulative region.

8. The semiconductor variable capacitor of claim 7, further comprising a fourth non-insulative region disposed adjacent to the semiconductor region, wherein:
the first non-insulative region is disposed above a fourth portion of the semiconductor region;
the third non-insulative region is disposed above a fifth portion of the semiconductor region;
the fourth portion of the semiconductor region is disposed adjacent to a portion of the first side of the fourth non-insulative region; and
the fifth portion of the semiconductor region is disposed adjacent to another portion of the first side of the fourth non-insulative region.

9. The semiconductor variable capacitor of claim 1, further comprising:
another insulative layer disposed above the semiconductor region;
a third non-insulative region disposed above the other insulative layer; and
another control region disposed adjacent to the semiconductor region such that a capacitance between the second non-insulative region and the third non-insulative region is configured to be adjusted by varying another control voltage applied to the other control region, wherein:
the third non-insulative region is disposed above a third portion of the semiconductor region;
the first portion and the second portion of the semiconductor region are disposed adjacent to the first side and the second side of the control region; and
the third portion of the semiconductor region is disposed adjacent to a corner portion of the second non-insulative region.

10. The semiconductor variable capacitor of claim 1, wherein the control voltage is applied to the control region with respect to the second non-insulative region.

* * * * *